(12) United States Patent
Zhang et al.

(10) Patent No.: US 12,113,139 B1
(45) Date of Patent: Oct. 8, 2024

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Yuanfang Zhang, Zhejiang (CN); Peiting Zheng, Zhejiang (CN); Jie Yang, Zhejiang (CN); Xinyu Zhang, Zhejiang (CN)

(73) Assignees: ZHEJIANG JINKO SOLAR CO., LTD., Haining Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/531,648

(22) Filed: Dec. 6, 2023

(30) Foreign Application Priority Data

Sep. 28, 2023 (CN) .......................... 202311285523.0

(51) Int. Cl.
*H01L 31/0224* (2006.01)
*H01L 31/0236* (2006.01)

(52) U.S. Cl.
CPC ............... *H01L 31/022441* (2013.01); *H01L 31/02363* (2013.01)

(58) Field of Classification Search
CPC .................. H01L 31/022441; H01L 31/02363
See application file for complete search history.

(56) References Cited

U.S. PATENT DOCUMENTS

| 2014/0299187 A1* | 10/2014 | Chang | H01L 31/02168 136/258 |
| 2014/0311567 A1* | 10/2014 | Choi | H01L 31/0745 136/258 |
| 2015/0007879 A1* | 1/2015 | Kwon | H01L 31/028 438/96 |

(Continued)

FOREIGN PATENT DOCUMENTS

| CN | 211789037 U | 10/2020 |
| CN | 115513339 A | 12/2022 |

(Continued)

OTHER PUBLICATIONS

Zhejiang Jinko Solar Co., Ltd. et al., Extended European Search Report, EP 23214990.6, Jun. 5, 2024, 7 pgs.

*Primary Examiner* — Golam Mowla
(74) *Attorney, Agent, or Firm* — USCH Law, PC

(57) ABSTRACT

The solar cell includes a substrate having electrode regions and non-electrode regions alternatingly. The electrode regions have a first surface, the non-electrode regions have a second surface, and the first surface has a smaller roughness than the second surface. The solar cell further includes a first tunneling dielectric layer formed over the first surface, a first doped conductive layer arranged on a side of the first tunneling dielectric layer, a passivation layer formed over the second surface and the first doped conductive layer, and at least one first electrode. The at least one first electrode are arranged in the electrode regions, each of the at least one first electrode includes a connecting electrode formed over the (Continued)

electrode regions and multiple spot electrodes. The multiple spot electrodes are arranged below the connecting electrode and connected to the connecting electrode.

20 Claims, 9 Drawing Sheets

(56) References Cited

U.S. PATENT DOCUMENTS

| | | | |
|---|---|---|---|
| 2015/0155828 A1* | 6/2015 | Nam | H01L 31/0747 324/761.01 |
| 2016/0056322 A1* | 2/2016 | Yang | H01L 31/0745 136/258 |
| 2019/0207040 A1* | 7/2019 | Harrington | H01L 31/022441 |
| 2020/0044105 A1* | 2/2020 | Kim | H01L 31/02008 |

FOREIGN PATENT DOCUMENTS

| | | | |
|---|---|---|---|
| CN | 116682872 A | 9/2023 | |
| EP | 4002495 A2 | 5/2022 | |
| KR | 20200021378 A | 2/2020 | |

\* cited by examiner

SOLAR CELL AND PHOTOVOLTAIC MODULE

CROSS-REFERENCE TO RELATED APPLICATION

The present application claims the benefit of priority under the Paris Convention to Chinese Patent Application No. 202311285523.0 filed on Sep. 28, 2023, which is incorporated herein by reference in its entirety.

TECHNICAL FIELD

Embodiments of the present application relate to the technical field of photovoltaics, and in particular to a solar cell and a photovoltaic module.

BACKGROUND

Currently, with the gradual depletion of fossil fuels, solar cells are becoming increasingly widely used as a new energy alternative. A solar cell is a device that converts the light energy of the sun into electrical energy. The solar cell uses the principle of photovoltaics to generate carriers, which are then extracted by electrodes to be effectively utilized as electrical energy.

The solar cell in the related technologies mainly includes an interdigitated back contact (IBC) cell, a tunnel oxide passivated contact (TOPCON) cell, a passivated emitter and real cell (PERC), and a heterojunction solar cell. By using different film layer settings and functional limitations to reduce optical loss and reduce the recombination of photo generated carriers on surfaces and inside a silicon substrate, the photovoltaic conversion efficiency of the solar cell can be improved.

However, the photoelectric conversion efficiency of the solar cell in the related technologies is still poor.

SUMMARY

The embodiments of the present application provide a solar cell and a photovoltaic module, which are at least beneficial for improving the photoelectric conversion efficiency of the solar cell.

According to some embodiments of the present application, in a first aspect, a solar cell is provided according to the present application, and the solar cell includes a substrate having electrode regions and non-electrode regions. The electrode regions are arranged alternatingly with the non-electrode regions. The electrode regions have surface roughness less than surface roughness of the non-electrode regions. The solar cell further includes a first tunneling dielectric layer having portions formed over the electrode regions, respectively, a first doped conductive layer formed over the first tunneling dielectric layer, a passivation layer formed over the non-electrode regions and the first doped conductive layer, and at least one first electrode formed over respective ones of the electrode regions. A respective first electrode of the multiple first electrodes includes a respective connecting electrode formed over a respective electrode region of the electrode regions and multiple spot electrodes arranged at intervals along a second direction. The multiple spot electrodes are arranged below at least an upper portion of the connecting electrode and connected to the connecting electrode. The multiple spot electrodes penetrate the passivation layer to be in contact with the first doped conductive layer, and the connecting electrode includes at least one material that is different from a material included in the multiple spot electrodes.

In some embodiments, the first doped conductive layer includes multiple doped conductive sublayers correspond to the multiple spot electrodes, respectively, and the multiple spot electrodes penetrate through the passivation layer to be in electrical contact with the multiple doped conductive sublayers, respectively.

In some embodiments, the first tunneling dielectric layer includes multiple tunneling dielectric sublayers correspond to the multiple doped conductive sublayers, respectively.

In some embodiments, an orthographic projection of each of the multiple spot electrodes is arranged within a corresponding doped conductive sublayer in the multiple doped conductive sublayers.

In some embodiments, the solar cell further includes an electrical connection layer arranged in the non-electrode regions between the substrate and the passivation layer, two opposite ends of the electrical connection layer along the first direction are in electrical contact with two adjacent doped conductive sublayers, respectively.

In some embodiments, a distance between two adjacent spot electrodes along the second direction is a first distance, a length of the multiple spot electrodes along the second direction is a first length, and a ratio of the first distance to the first length is from 10 to 400. In some embodiments, the first length ranges from 5 μm to 50 μm.

In some embodiments, the connecting electrode has a second length along the second direction, and a ratio of a total length of the multiple spot electrodes along the second direction to the second length is from 0.003 to 0.2.

In some embodiments, there are N spot electrodes arranged below the connecting electrode, and N is greater or equal to 100.

In some embodiments, each of the non-electrode regions has multiple first protrusion structures, the first doped conductive layer has a micro textured structure including multiple micro protrusion structures on a side away from the first tunneling dielectric layer, the multiple micro protrusion structures are smaller than the multiple first protrusion structures, and the micro textured surface structure has a greater roughness than the electrode regions.

In some embodiments, the electrode regions have a flat surface.

In some embodiments, the substrate has a first side and a second side opposite to the first side, the first side includes the electrode regions and the non-electrode regions, and the solar cell further includes: a first passivation layer arranged on the second side, and a second doped conductive layer arranged on a side of the first passivation layer away from the substrate. The first doped conductive layer has one of N-type doping elements or P-type doping elements, and the second doped conductive layer has the other of N-type doping elements or P-type doping elements.

In some embodiments, third doping elements in the substrate has a same conductivity type as first doping elements in the first doped conductive layer.

In some embodiments, the second side has a greater roughness than the electrode regions.

In some embodiments, the solar cell further includes: an emitter arranged in the electrode regions and the non-electrode regions. The emitter is arranged between the substrate and the first tunneling dielectric layer, and arranged between the substrate and the passivation layer. The emitter is conformal to the electrode regions and the non-electrode regions.

In some embodiments, the solar cell further includes a doped layer arranged between the substrate of the non-electrode region and the passivation layer, and the conductivity type of the fourth doping element of the doped layer is the same as that of the first doping element of the first doped conductive layer.

In some embodiments, the fourth doping elements have a doping concentration less than or equal to the first doping elements.

According to some embodiments of the present application, in a second aspect, a photovoltaic module is further provided according to the present application, and the photovoltaic module includes: at least one cell string formed by connecting multiple the solar cell according to any one of above embodiments in the first aspect. The photovoltaic module further includes at least one encapsulation adhesive film configured to cover the at least one cell string, and at least one cover plate configured to cover the at least one encapsulation adhesive film.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated. For more clearly illustrating embodiments of the present application or the technical solutions in the conventional technology, drawings referred to for describing the embodiments or the conventional technology will be briefly described hereinafter. Apparently, drawings in the following description are only examples of the present application, and for the person skilled in the art, other drawings may be acquired based on the provided drawings without any creative efforts.

DETAILED DESCRIPTION

Figure 1:
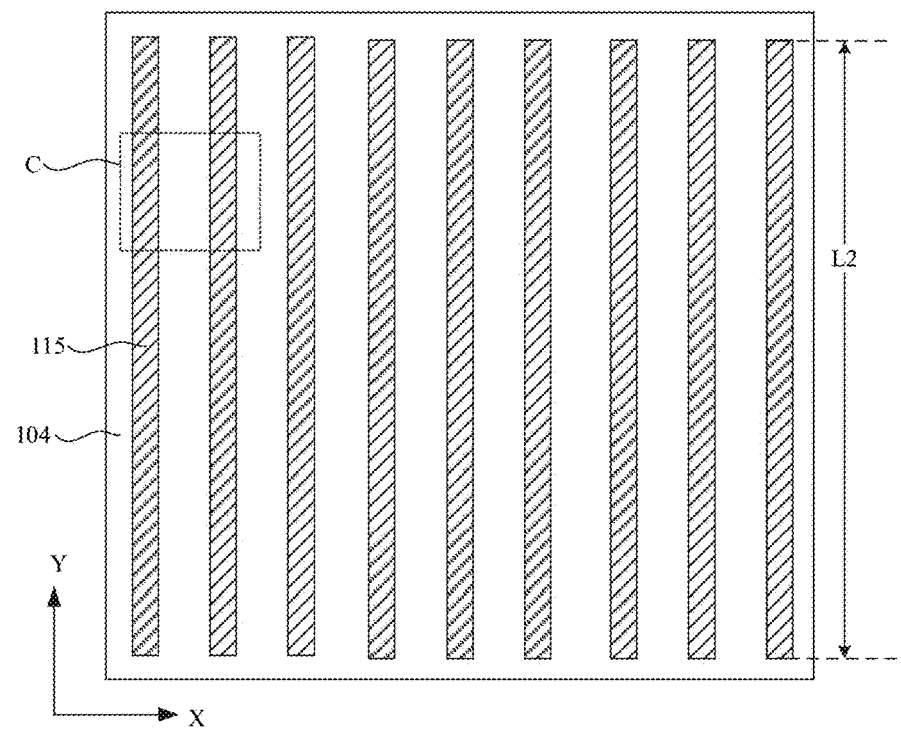
FIG. 1 is a top view of a solar cell provided according to an embodiment of the present application.

In the solar cell provided according to the embodiments of the present application, the roughness of the electrode regions is smaller than that of the non-electrode regions. The high roughness of the non-electrode regions indicates that a surface of the non-electrode regions has protrusions and recesses, which can increase the internal reflection of incident light and thus improve the utilization rate of light. The low roughness of the electrode regions indicates that a surface of the electrode regions is relatively flat, resulting in better deposition performance of the first tunneling dielectric layer and the first doped conductive layer deposited on the electrode regions, so that the first tunneling dielectric layer and the first doped conductive layer have a high density and can play a good passivation effect to reduce surface defects on the surface of the electrode regions. The first electrode includes a connecting electrode and multiple spot electrodes arranged along the second direction. Each of the multiple spot electrodes penetrates through the passivation layer to be in electrical contact with the first doped conductive layer, which causes less damage to the integrity of the passivation layer, thereby enabling the passivation layer to form good passivation on more surfaces of the substrate and reducing surface defects of the substrate. In addition, compared to the solution in which entire electrode burning through the passivation layer, the multiple spot electrodes penetrate through the passivation layer to be in contact with the first doped conductive layer, which reduces the silver slurry used in preparing the first electrode and thus reducing costs.

Moreover, in response to the multiple spot electrodes burning through the passivation layer, it indicates that the slurry of the multiple spot electrodes is a high-temperature burning through slurry. Conversely, in response to the connecting electrode not burning through the passivation layer, the connecting electrode is prepared by a non-burning-through low-temperature slurry, which can reduce the damage to the solar cell caused by high temperature and also reduce the possibility of doping elements in the first doped conductive layer passing through the first tunneling dielectric layer to enter the substrate.

In addition, the electrode regions have a low roughness. In order to improve the passivation effect of the first tunneling dielectric layer and the first doped conductive layer, the first electrode is designed as spot electrodes and the connecting electrode, which further reduces the impact of electrode sintering on the passivation effect of the first tunneling dielectric layer and the first doped conductive layer, thereby improving the efficiency of the solar cell. The multiple spot electrodes can also reduce the damage caused by electrode material burning through the first tunneling dielectric layer.

The embodiments of the present application will be described in detail below with reference to the accompanying drawings. However, those of ordinary skill in the art can understand that, in various embodiment of the present application, many technical details are set forth in order to provide the reader with a better understanding of the present application. However, the technical solutions claimed in the present application may be realized even without these technical details and various changes and modifications based on the following embodiments.

Figure 2:
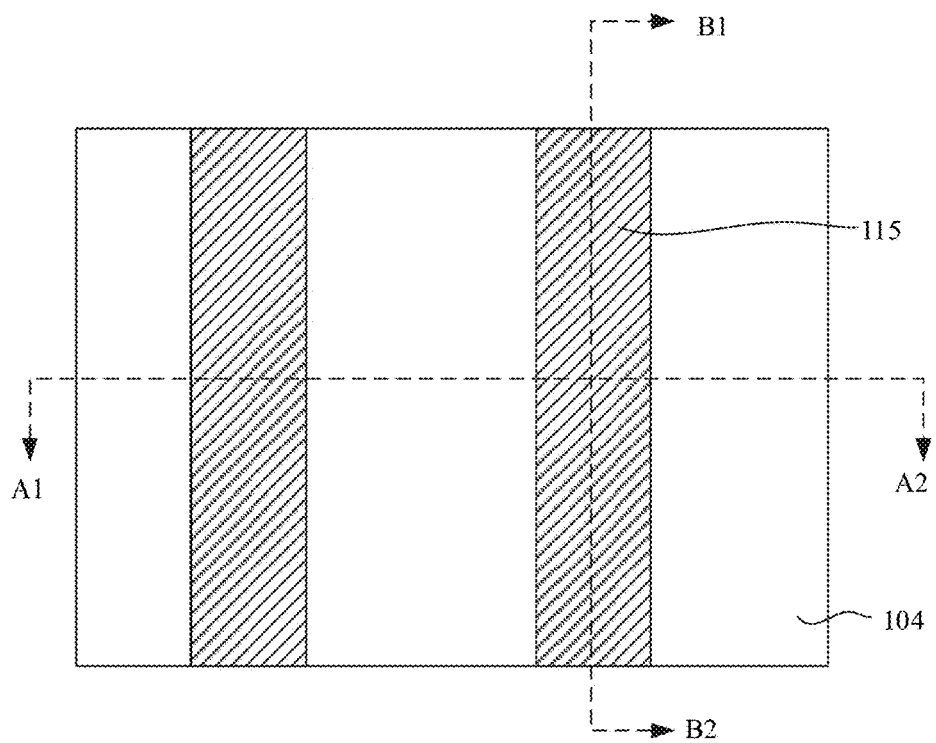
FIG. 2 is a local enlarged view of a solar cell at location C shown in FIG. 1.
Figure 3:
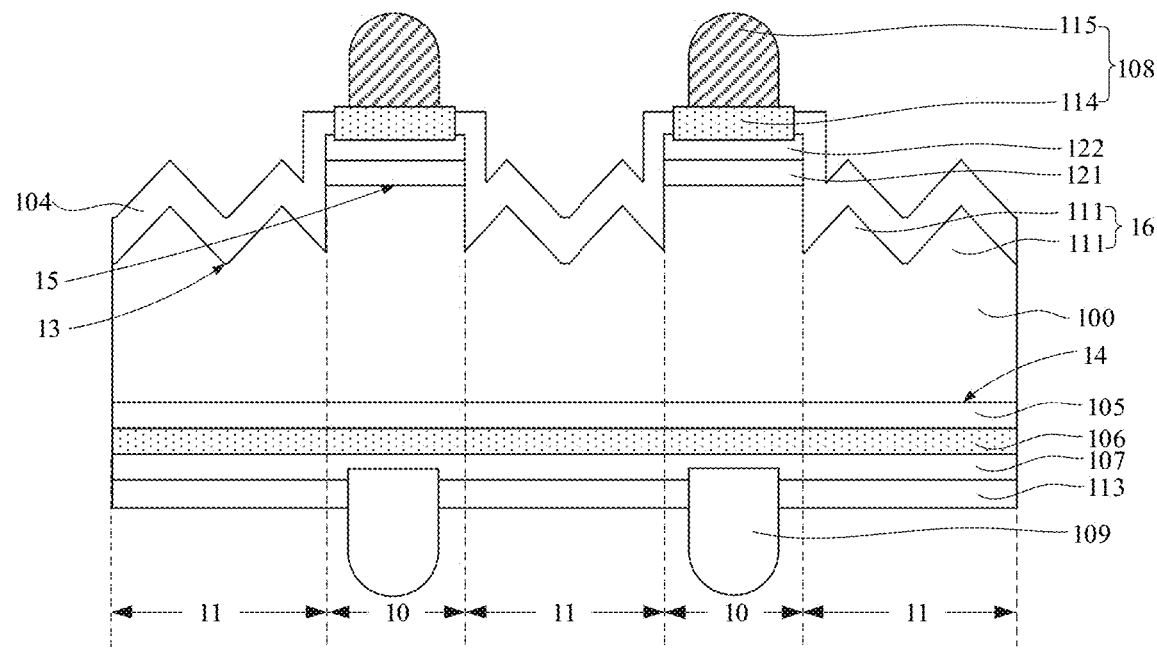
FIG. 3 is a cross-sectional view of a solar cell shown in FIG. 2 along A1-A2.
Figure 4:
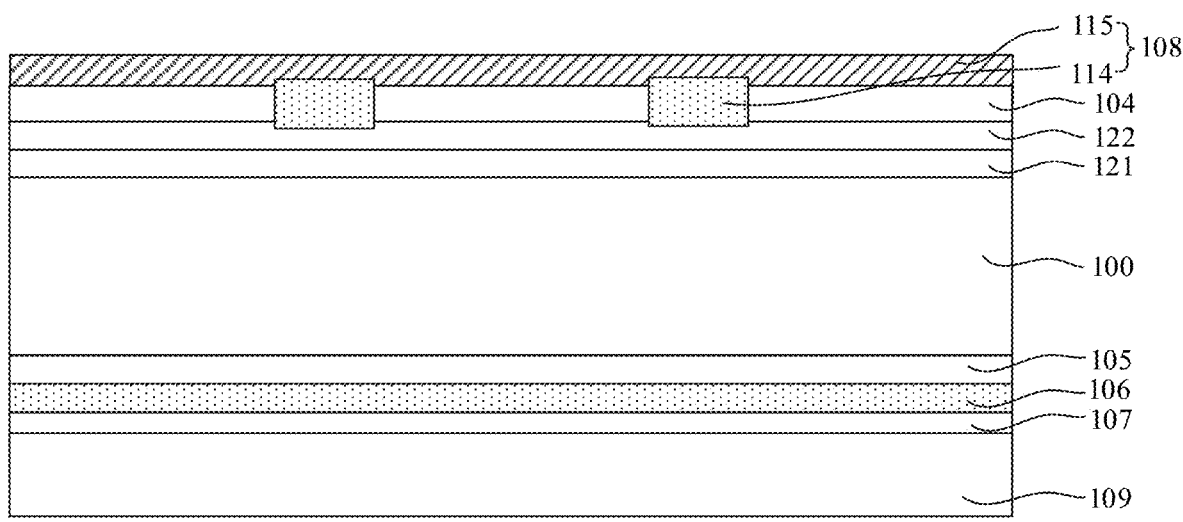
FIG. 4 is a cross-sectional view of a solar cell shown in FIG. 2 along B1-B2.
Figure 5:
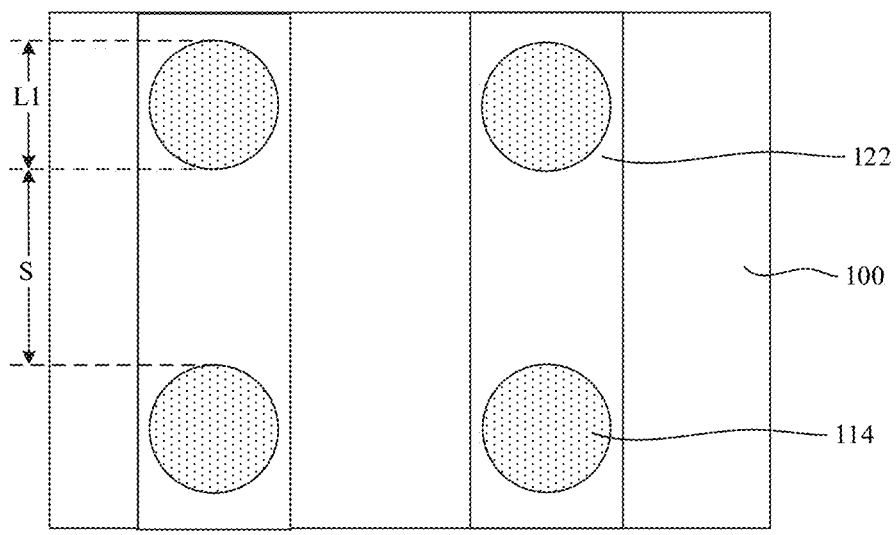
FIG. 5 is a local top view of a spot electrode in a solar cell provided according to an embodiment of the present application.

FIG. 1 is a top view of a solar cell provided according to an embodiment of the present application. FIG. 2 is a local enlarged view of a solar cell at location C shown in FIG. 1. FIG. 3 is a cross-sectional view of a solar cell shown in FIG. 2 along A1-A2. FIG. 4 is a cross-sectional view of a solar cell shown in FIG. 2 along B1-B2. FIG. 5 is a local top view of a spot electrode in a solar cell provided according to an embodiment of the present application. In order to illustrate the positional relationship between the spot electrodes and the first doped conductive layer, the passivation layer is not shown in FIG. 5.

Referring to FIG. 1 to FIG. 4, according to some embodiments of the present application, in the first aspect, a solar cell is provided according to the present application, and the solar cell includes a substrate 100, which has electrode regions and non-electrode regions alternatingly arranged along a first direction X.

In some embodiments, the material of the substrate 100 is an elemental semiconductor material. Specifically, elemental semiconductor materials are composed of a single element, such as silicon. Among them, the element semiconductor material is in a single crystal state, a polycrystalline state, an amorphous state, or a microcrystalline state (with both single crystal and amorphous states, referred to as microcrystalline state), for example, silicon is at least one of monocrystalline silicon, polycrystalline silicon, amorphous silicon, or microcrystalline silicon.

In some embodiments, the material of the substrate 100 is a compound semiconductor material. Common compound semiconductor materials include but are not limited to materials such as silicon germanide, silicon carbide, gallium arsenide, indium gallide, perovskite, cadmium telluride, copper indium selenium, etc. The substrate 100 may also be a sapphire substrate, a silicon substrate on an insulator, or a germanium substrate on an insulator.

In some embodiments, the substrate 100 is an N-type semiconductor substrate or a P-type semiconductor substrate. The N-type semiconductor substrate is doped with N-type doping elements, which can be any of the V group elements such as phosphorus (P), bismuth (Bi), antimony (Sb), or arsenic (As). The P-type semiconductor substrate is doped with P-type elements, which can be any of the III group elements such as boron (B), aluminum (Al), gallium (Ga), or gallium (In).

In some embodiments, the substrate 100 has a first side 13 and a second side 14 opposite to the first side 13, and the first side 13 includes a first surface 15 and a second surface 16.

Referring to FIG. 3, the first side 13 of the substrate 100 may be a front side and the second side 14 may be a back side, or the first side 13 of the substrate 100 may be a back side and the second side 14 may be a front side. That is, the solar cell is a single-sided cell, the front side can serve as a receiving surface for receiving incident light, and the back side can serve as a backlight surface. In some embodiments, the solar cell is a double-sided cell, where the first side 13 and second side 14 of the substrate 100 can serve as light receiving surfaces and can be used to receive incident light.

In some embodiments, the electrode regions 10 refers to a region within the substrate 100 that is directly opposite to the at least one first electrode 108 along the thickness direction of the substrate 100, or can be understood as the region where the at least one first electrode 108 is projected orthographically on the substrate 100. On the contrary, a region that is not directly opposite to the at least one first electrode 108 is the non-electrode regions 11. That is, the electrode regions are metallization pattern regions, the non-electrode regions are non-metallization pattern regions. The area of the electrode regions 10 is greater than or equal to the orthographic projection of the multiple first at least one first electrode 108 on the substrate 100, that is, a width of each respective electrode region is 1 to 5 times of a width of a respective electrode, which ensures that all regions in contact with at least one first electrode 108 are the electrode regions 10.

It is worth noting that the above definitions of the electrode regions 10 and the non-electrode regions 11 are for non-IBC cells, where the two conductive electrodes of different polarities of the solar cell are arranged on two opposite sides of the substrate 100, respectively, rather than on the same side of the substrate 100. In response to the solar cell being an IBC cell or two conductive electrodes with different polarities being arranged on the same side of the substrate 100, the electrode regions 10 refers to a region that is directly opposite to one conductive electrode with a polarity and the other conductive electrode with different polarities, and the non-electrode regions 11 refers to a region that is not directly opposite to neither of the two conductive electrodes with different polarities.

In some embodiments, the electrode regions 10 has a first surface 15, and the non-electrode regions 11 has a second surface 16. The roughness of the first surface 15 is smaller than that of the second surface 16.

It is worth noting that the difference in roughness here is due to the height of the textured structure on the surface of the substrate 100 in the non-electrode regions 11 being greater than the height of the surface of the substrate 100 in the electrode regions 10, or the degree of protrusions and recesses on the surface of the substrate 100 in the non-electrode regions 11 being greater than that of the surface of the substrate 100 in the electrode regions 10. The roughness refers to an arithmetic mean of the absolute value of the Z-direction deviation relative to the mean line over a sampling length. The roughness can be measured by comparison, light cutting, interferometry, and needle tracing.

In some embodiments, the first surface 15 includes a flat surface, which includes a polished surface.

It is worth noting that the polished surface refers to the flat surface formed by removing the surface texture by polishing solution or laser etching. After polishing, the surface flatness of substrate 100 increases, which increases reflection of light with longer wavelength and promotes secondary absorption of projected light, thereby increasing short-circuit current. At the same time, due to the decrease in surface specific surface region of the substrate 100, the surface recombination of substrate 100 is reduced, and the surface passivation effect of substrate 100 can be improved.

It can be understood that a flat surface refers to a relatively flat surface, rather than an absolutely flat surface. Generally, surfaces with a roughness of less than or equal to 5 μm and greater than or equal to −5 μm are characterized as flat surfaces. In addition, the flat surface may also refer to a surface with lower roughness than the first surface structure.

In some embodiments, the second surface 16 includes a regular shaped pyramid textured structure and irregularly shaped black silicon. The inclined surface of the second surface 16 can increase the internal reflection of incident light, which improves the absorption and utilization of incident light by the substrate 100, thereby improving the efficiency of the solar cell.

In some embodiments, the second surface 16 has multiple first protrusion structures 111. The arrangement height and size of the multiple first protrusion structures 111 can be within any range known to those skilled in the art, which will not be limited to the embodiments of the present application.

The definition of the size of the multiple protrusion structures 111 obtained by randomly specifying a certain region within the surface range of the substrate 100, detecting the one-dimensional size of the bottom surface of each first protrusion structure 111 within this region, and ultimately taking the average value. It can be seen that the size of the protrusion structure refers to the range of the region average value, not all ranges of the size of the first protrusion structure 111 within the substrate 100, and all ranges of the size of the first protrusion structure are generally greater than the range of the average value. As an example, the morphology of each first protrusion structure 111 in FIG. 3 is the same, the size of the multiple first protrusion structures 111 equal to the average one-dimensional size.

It is worth noting that one-dimensional dimension refers to the distance between two diagonals in the bottom shape of the first protrusion structure 111. In some embodiments, the one-dimensional dimension may also be the distance between the two sides of the bottom shape. Among them, surface of each of the multiple first protrusion structures 111 away from the second side 14 is fitted to construct a virtual surface as the bottom surface, which is a simulated surface that does not exist in actual solar cell. For example, in the embodiments of the present application, the surface of some of the multiple first protrusion structures 111 away from the second side 14 is flush with the bottom surface, or the surface of some of the first protrusion structure 111 away from the second side 14 is higher or lower than the bottom surface.

In some embodiments, the size of each of the multiple first protrusion structures 111 ranges from 100 nm to 10 μm. The size of the first protrusion structure 111 are 100 nm to 300 nm, 300 nm to 600 nm, 600 nm to 1000 nm, 1 μm to 2 μm, 2 μm to 4 μm, 4 μm to 7 μm, or 7 μm to 10 μm. The height of the first protruding structure 111 is between 100 nm and 10 μm. The height of the first protruding structure 111 is 100 nm to 450 nm, 450 nm to 700 nm, 700 nm to 1700 nm, 1.7 μm to 3.2 μm, 3.2 μm to 6.1 μm, 6.1 μm to 8.5 μm, or 8.5 μm to 10 μm. The size of the multiple first protrusion structures 111 within the above range can ensure that the defects on the second surface 16 of the substrate 100 are small, and the inclined surface of the first protrusion structure 111 can reflect incident light multiple times, thereby improving the utilization rate of light. In addition, the height of the first protrusion structure 111 refers to the vertical distance between the highest point of the first protrusion structure 111 away from the second side 14 and the bottom surface.

In some embodiments, the solar cell includes a first tunneling dielectric layer 121. The first tunneling dielectric layer 121 is formed over the first surface. The solar cell includes a first doped conductive layer 122 arranged on a side of the first tunneling dielectric layer 121 away from the substrate 100.

In some embodiments, the first tunneling dielectric layer 121 and the first doped conductive layer 122 form a passivate contact structure. The first doped conductive layer 122 can form a bending in energy band on the surface of the substrate 100, and the first tunneling dielectric layer 121 causes an asymmetric shift in the energy band on the surface of the substrate 100, resulting in a lower barrier for the majority carriers in than for the minority carriers. Therefore, the majority carriers can easily undergo quantum tunneling through the first tunneling dielectric layer 121, while the minority carriers are difficult to achieve selective carrier transport through the first tunneling dielectric layer 121.

In addition, the first tunneling dielectric layer 121 has a chemical passivation effect. Specifically, due to the presence of interface state defects at the interface between the substrate 100 and the first tunneling dielectric layer 121, the interface state density on the back of the substrate 100 is relatively high. An increase in the interface state density will promote the recombination of photo generated carriers, which increases the filling factor, short circuit current, and open circuit voltage of the solar cell, and improves the photoelectric conversion efficiency of the solar cell. The first tunneling dielectric layer 121 is arranged on the first surface 21 of the substrate 100, so that the first tunneling dielectric layer 121 has a chemical passivation effect on the surface of the substrate 100. Specifically, by saturating the hanging bonds of the substrate 100, the defect state density of the substrate 100 is reduced, and the recombination center of the substrate 100 is reduced to lower the carrier recombination rate.

In some embodiments, the material of the first tunneling dielectric layer 121 includes at least one of silicon oxide, silicon nitride, silicon nitride, silicon carbide, or magnesium fluoride.

The first doped conductive layer 122 has a field passivation effect. Specifically, an electrostatic field directed towards the interior of the substrate 100 is formed on the surface of the substrate 100, which causes the minority carriers to escape the interface, reduces the concentration of minority carriers, and reduces the recombination rate of carriers at the interface of the substrate 100, thereby increasing the open circuit voltage, short circuit current, and filling factor of the solar cell, and improving the photoelectric conversion efficiency of the solar cell.

The material of the first doped conductive layer 122 includes at least one of amorphous silicon, polycrystalline silicon, or silicon carbide.

The first doped conductive layer 122 is doped with doping elements of the same type as the substrate 100. For example, in response to the type of doping elements in the substrate 100 being P-type, the doping elements in the first doped conductive layer 122 is also P-type. In response to the type of doping elements in the substrate 100 being N-type, the doping elements inside the first doped conductive layer 122 is also N-type.

The concentration of doping elements in the first doped conductive layer 122 is greater than that of the substrate 100, in order to form a sufficiently high potential barrier on the rear surface of the substrate 100, so that majority carriers in the substrate 100 can tunnel through the first tunneling dielectric layer 121 to the first doped conductive layer 122.

In some embodiments, the thickness of the first tunneling dielectric layer 121 ranges from 0.5 nm to 5 nm. Optionally, the thickness range of the first tunneling dielectric layer 121 is from 0.5 nm to 1.3 nm, from 1.3 nm to 2.6 nm, from 2.6 nm to 4.1 nm, or from 4.1 nm to 5 nm. If the first tunneling dielectric layer 121 falls within any of the above ranges, the thickness of the first tunneling dielectric layer 121 is relatively thin, and majority carriers can easily undergo quantum tunneling through the first tunneling dielectric layer 121, while minority carriers are difficult to achieve selective carrier transport through the first tunneling dielectric layer 121.

In some embodiments, the solar cell includes a passivation layer 104. The passivation layer 104 is arranged on the second surface 16 and a surface of the first doped conductive layer 122.

In some embodiments, the passivation layer 104 is a single-layer structure or a stacked structure, and the material of the passivation layer 104 is one or more of materials such as silicon oxide, silicon nitride, silicon nitride, carbon nitrogen oxide, titanium oxide, hafnium oxide, or alumina.

In some embodiments, the solar cell includes at least one first electrode 108 arranged sequentially along the first direction X. The at least one first electrode 108 are arranged in the electrode regions 10, each of the at least one first electrode 108 includes a connecting electrode 115 formed over the electrode regions 10 and multiple spot electrodes 114 arranged along a second direction Y. The multiple spot electrodes 114 are arranged below the connecting electrode 115 and connected to the connecting electrode 115. The multiple spot electrodes 114 penetrate through the passivation layer 104 to be in contact with the first doped conductive layer 122, and the connecting electrode 115 includes different materials from the multiple spot electrodes 114.

In some embodiments, a distance between two adjacent first electrodes 108 along the second direction Y ranges from 0.5 mm to 2 mm, such as 0.5 mm to 0.8 mm, 0.8 mm to 1.15 mm, 1.15 mm to 1.28 mm, 1.28 mm to 1.46 mm, 1.46 mm to 1.68 mm, 1.68 mm to 1.84 mm, or 1.84 mm to 2 mm.

In some embodiments, the width of the at least one first electrode 108 along the first direction X ranges from 5 μm to 50 μm, such as 5 μm to 9 μm, 9 μm to 14 μm, 14 μm to 23 μm, 23 μm to 34 μm, 34 μm to 42 μm, 42 μm to 45 μm, 45 μm to 48 μm, or 48 μm to 50 μm.

In some embodiments, the multiple spot electrodes 114 is formed by sintering slurry in a burn-through type. The operation of forming the multiple spot electrodes 114 includes printing metal slurry on the surface of a part of the passivation layer 104 or an anti-reflection layer by a screen-printing process. The metal slurry includes at least one of silver, copper, tin, gold, lead, or nickel. The sintering process is carried out on the metal slurry. In some embodiments, the metal slurry contains materials with high corrosive components such as glass. Therefore, during the sintering process, the corrosive components will corrode the passivation layer 104 or the anti-reflection layer, which causes the metal slurry to penetrate into the passivation layer 104 or the anti-reflection layer to be in electrical contact with the first doped conductive layer 122.

In some embodiments, the connecting electrode 115 is formed by sintering slurry in a non-burn-through type, which is printed to be in direct contact with the multiple spot electrodes 114. The connecting electrode 115 has less damage to the passivation layer 104. By limiting the number and size of the multiple spot electrodes 114, it ensures that the electrode can have electrical contact with the first doped conductive layer 122, while also allowing the passivation layer to fully exert its passivation effect, which reduces metal recombination on the substrate 100 and the first doped conductive layer 122. In addition, due to the absence of excessive glass powder in the non-burn-through type slurry to damage the PN junction, metal recombination can be effectively reduced, thereby improving the open circuit voltage of the solar cell, and improving the conversion efficiency of the solar cell.

The traditional slurry includes a mixture of metal powder, glass powder, and organic carriers. The non-burn-through type slurry refers to the slurry containing lower glass powder content than traditional slurry, which has weak burn through ability during the sintering process and does not require or cannot burn through the passivation layer. The burn-through type slurry refers to the slurry with strong burn through ability and the ability to burn through the passivation layer during the sintering process.

In some cases, the difference in materials between the connecting electrode 115 and the multiple spot electrodes 114 refers to the difference in composition between the slurry used to form the connecting electrode 115 and the slurry of the multiple spot electrodes 114. For example, the slurry used in forming the connecting electrode 115 contains 1% glass powder, 58% silver powder, and 41% organic carrier, and the slurry used in forming the multiple spot electrodes 114 contains 5% glass powder, 53% silver powder, and 42% organic carrier.

In some embodiments, the non-burn-through type slurry contains glass powder with a mass percentage greater than 0 and not exceeding 1.5%. For example, the non-burn-through type slurry contains glass powder with mass percentages of 0.1%, 0.3%, 0.5%, 0.7%, 1%, 1.3%, and 1.5%.

In some embodiments, the non-burn-through type slurry includes but is not limited to silver slurry or silver aluminum slurry.

In some embodiments, the cross-sectional shape of the multiple spot electrodes 114 in a direction parallel to the surface of the substrate 100 is circular as shown in FIG. 5, or may be square, rectangular, elliptical, rectangular, or any other shape.

In some embodiments, referring to FIG. 5, two adjacent spot electrodes 114 along the second direction Y has a first distance S, and the multiple spot electrodes 114 has a first length L1 along the second direction Y. A ratio of the first distance S to the first length L1 ranges from 10 to 400, such as 10 to 53, 53 to 106, 106 to 168, 168 to 204, 204 to 288, 288 to 316, 316 to 368, or 368 to 400.

In some embodiments, the first length L1 ranges from 5 μm to 50 μm, such as 5 μm to 9 μm, 9 μm to 14 μm, 14 μm to 23 μm, 23 μm to 34 μm, 34 μm to 42 μm, 42 μm to 45 μm, 45 μm to 48 μm, or 48 μm to 50 μm.

In some embodiments, the width of the multiple spot electrodes 114 along the first direction X ranges from 5 μm to 50 μm, such as 5 μm to 8.3 μm, 8.3 μm to 13.9 μm, 13.9 μm to 18.1 μm, 18.1 μm to 25.6 μm, 25.6 μm to 33.1 μm, 33.1 μm to 40.3 μm, 40.3 μm to 47 μm or 47 μm to 50 μm.

In some embodiments, the connecting electrode 115 has a second length L2 along the second direction Y, and a ratio of the total length of multiple spot electrodes 114 along the second direction to the second length L2 ranges from 0.003 to 0.2, such as 0.003 to 0.018, 0.018 to 0.05, 0.05 to 0.08, 0.08 to 0.12, 0.12 to 0.14, 0.14 to 0.16, 0.16 to 0.18, or 0.18 to 0.2.

In some embodiments, there are N spot electrodes arranged below the connecting electrode, and N is greater or equal to 100, such as N≥153, N≥206, N≥238, or N≥298.

In some embodiments, reference is continuously made to FIG. 3, the solar cell further includes: a first passivation layer 105 arranged on the second side 14, and a second doped conductive layer 106 arranged on a side of the first passivation layer 105 away from the substrate 100. The first doped conductive layer 122 has one of N-type doping elements and P-type doping elements, and the second doped conductive layer 106 has the other of N-type doping elements and P-type doping elements.

In some embodiments, the first passivation layer 105 includes an intrinsic passivation layer or a second tunneling dielectric layer.

In response to the first passivation layer 105 being an intrinsic passivation layer, a heterojunction structure is formed between the intrinsic passivation layer and the substrate 100. The heterojunction structure not only enables the interface between the intrinsic passivation layer and the substrate 100 to form a higher open circuit voltage, but also achieves better passivation effect, thus making it easier to improve the photoelectric conversion efficiency.

In some embodiments, the solar cell further includes: a transparent conductive layer 107 and a second passivation layer 113 stacked sequentially. The transparent conductive layer 107 is formed over the intrinsic passivation layer. The solar cell further includes multiple second electrodes 109 penetrating through the second passivation layer to be in electrical contact with the transparent conductive layer.

In some embodiments, a material of the intrinsic passivation layer 105 includes intrinsic amorphous silicon, intrinsic microcrystalline silicon, intrinsic silicon oxide, intrinsic nanocrystalline silicon, or intrinsic silicon carbide. The optional thickness of the intrinsic passivation layer 105 is greater than or equal to 2 μm and less than or equal to 10 μm, a preferred thickness of the intrinsic passivation layer 105 is 5 μm. In some embodiments, due to the diffusion of other film layers or the influence of doping process conditions, the intrinsic passivation layer 105 includes a small amount of doping elements.

In some embodiments, the second doped conductive layer 106 includes one of N-type doped or P-type doped amorphous silicon, amorphous silicon oxide, amorphous silicon carbide, microcrystalline silicon, hydrogenated microcrystalline silicon, microcrystalline silicon oxide, microcrystalline silicon carbide, polycrystalline silicon semiconductor thin films, or a composite thin film layers including more than one of the above. The thickness of the second doped conductive layer 106 ranges from 4 nm to 30 nm.

The hydrogenated microcrystalline silicon can bring a larger bandgap and narrower absorption spectrum range, which can effectively improve the photoelectric conversion efficiency of the solar cell. Moreover, as the crystallization rate increases, the series resistance decreases, and the filling factor increases, which improves the output current of the solar cell and effectively extends the service life of the solar cell.

In some embodiments, the transparent conductive layer 107 includes at least one of tin doped indium oxide (ITO), aluminum doped zinc oxide (AZO), cerium doped indium oxide, and tungsten doped indium oxide.

In some embodiments, a PN junction is formed between the second doped conductive layer 106 and the substrate 100. The intrinsic passivation layer 105 is inserted between PN junctions as a buffer layer, and the intrinsic passivation layer 105 has a good passivation effect on the surface of substrate 100, which can greatly avoid carrier recombination and achieve higher minority carrier lifetime and higher open circuit voltage.

In response to the first passivation layer 122 being the second tunneling dielectric layer, the second tunneling dielectric layer and the second doped conductive layer 106 form a passivation contact structure, in which the function and setting of the second tunneling dielectric layer can refer to the function and setting of the first tunneling dielectric layer, which will not be elaborated here. Similarly, the function and setting of the second doped conductive layer 106 can refer to the function and setting of the first doped conductive layer 122.

For the solar cell shown in FIG. 3, in some embodiments, the substrate 100 includes one of N-type doping elements and P-type doping elements, and the first doped conductive layer 122 includes the other of N-type doping elements or P-type doping elements. Therefore, a PN junction is formed between the substrate 100 and the first doped conductive layer 122. In response to the PN junction being irradiated by the sun, new pairs of hole and electron are formed. Under the action of an electric field built in the PN junction, photo generated holes flow to the p-region and photo generated electrons flow to the n-region. After the circuit is connected, a current is generated. For example, in response to the substrate 100 being n-type doped, the substrate 100 is the n-region. In response to the first doped conductive layer 122 being p-type doped, the first doped conductive layer 122 is the p-region. The p-type semiconductor has a hole (the p-type semiconductor loses one negatively charged electron, which can be considered as an additional positive charge), and the potential difference between the p-type semiconductor and the n-type semiconductor is one more free electron to generate electricity. Therefore, when sunlight irradiating, light energy excites electrons in silicon atoms (photoelectric effect), resulting in convection of electrons and holes. These electrons and holes are affected by the built-in potential and gather in the n region and p region, respectively. At this time, the external is connected through electrodes to form a circuit to generate current.

In some embodiments, the conductivity type of the third doping element within the substrate 100 is the same as that of the first doping element in the first doped conductive layer 122. The passivation contact structure and high low junction are formed between the substrate 100 and the first doped conductive layer 122, which promotes the migration of carriers within the substrate 100 to the first doped conductive layer 122 under the action of an internal electric field, and is then absorbed by the electrode, which is conducive to improving the battery efficiency of the battery. The second doped conductive layer 106 forms a PN junction with the substrate 100.

In the solar cell provided according to the embodiments of the present application, the roughness of the first surface 15 is smaller than that of the second surface 16. The high roughness of the non-electrode regions 11 indicates that a surface of the non-electrode regions 11 has protrusions and recesses, which can increase the internal reflection of incident light and thus improve the utilization rate of light. The low roughness of the electrode regions 10 indicates that a surface of the electrode regions 10 is relatively flat, resulting in better deposition performance of the first tunneling dielectric layer 121 and the first doped conductive layer 122 deposited on the electrode regions 10, so that the first tunneling dielectric layer 121 and the first doped conductive layer 122 have a high density and can play a good passivation effect to reduce surface defects on the surface of the electrode regions 10. The first electrode 108 includes a connecting electrode 115 and multiple spot electrodes 114 arranged along the second direction Y. Each of the multiple spot electrodes 114 penetrates through the passivation layer 104 to be in electrical contact with the first doped conductive layer 122, which causes less damage to the integrity of the passivation layer 104, thereby enabling the passivation layer 104 to form good passivation on more surfaces of the substrate 100 and reducing surface defects of the substrate 100. In addition, compared to the solution in which entire electrode burning through the passivation layer 104, the multiple spot electrodes 114 penetrate through the passivation layer 104 to be in contact with the first doped conductive layer 122, which reduces the silver slurry used in preparing the first electrode 108 and thus reducing costs.

Moreover, in response to the multiple spot electrodes 114 burning through the passivation layer 104, it indicates that the slurry of the multiple spot electrodes 114 is a high-temperature burning through slurry. Conversely, in response to the connecting electrode 115 not burning through the passivation layer 104, the connecting electrode 115 is prepared by a non-burning-through low-temperature slurry, which can reduce the damage to the solar cell caused by high temperature and also reduce the possibility of doping elements in the first doped conductive layer 122 passing through the first tunneling dielectric layer 121 to enter the substrate 100.

In addition, the electrode regions 10 has a low roughness. In order to improve the passivation effect of the first tunneling dielectric layer 121 and the first doped conductive layer 122, the first electrode 108 is designed as spot electrodes 114 and the connecting electrode 115, which further reduces the impact of electrode sintering on the passivation effect of the first tunneling dielectric layer 121 and the first doped conductive layer 122, thereby improving the efficiency of the solar cell. The multiple spot electrodes 114 can also reduce the damage caused by electrode material burning through the first tunneling dielectric layer 121.

In response to the second side 14 having a heterojunction structure, the design of the multiple spot electrodes 114 and the connecting electrode 115 can reduce the time and temperature of the entire solar cell being placed at environment with a high temperature, which reduces the impact of high temperature on the heterojunction structure, thereby reducing the damage of high temperature to passivation effect, and improving the battery efficiency of the solar cell.

Figure 6:
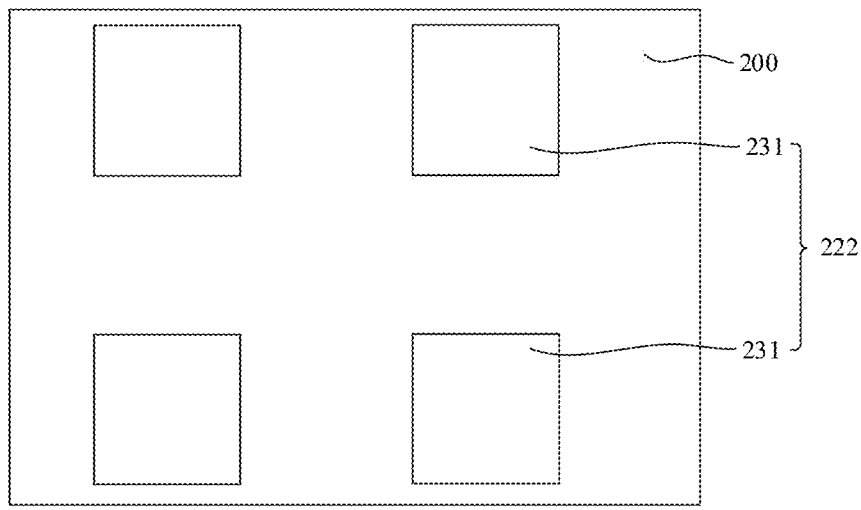
FIG. 6 is a local top view of a doped conductive sublayer in a solar cell provided according to another embodiment of the present application.
Figure 7:
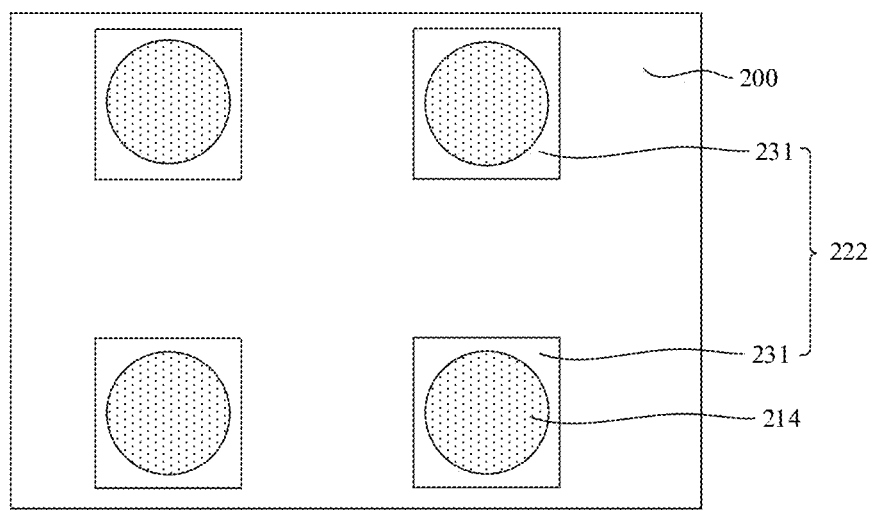
FIG. 7 is a local top view of a spot electrode in a solar cell provided according to another embodiment of the present application.
Figure 8:
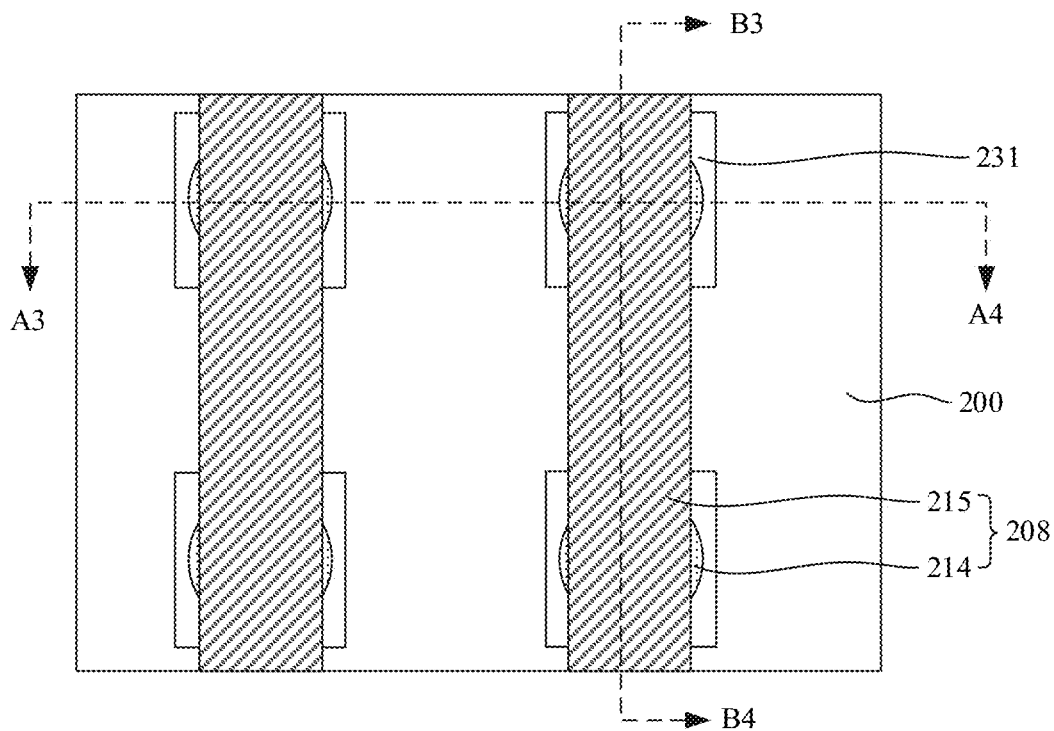
FIG. 8 is a local top view of a connecting electrode in a solar cell provided according to another embodiment of the present application.
Figure 9:
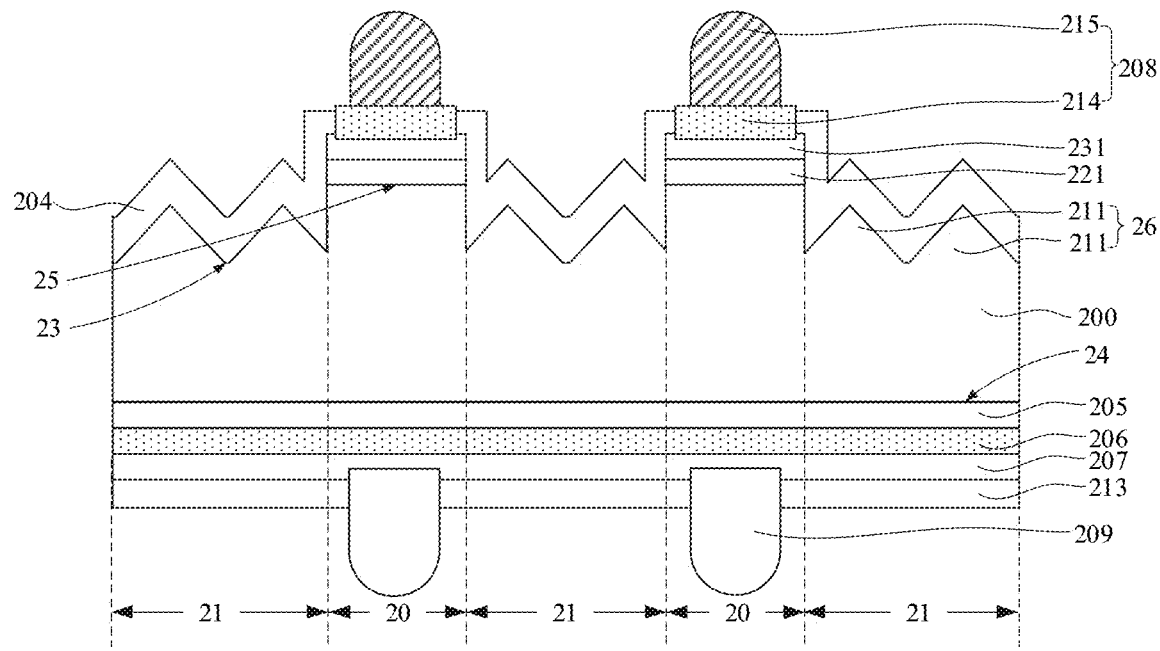
FIG. 9 is a cross-sectional view of a solar cell shown in FIG. 8 along A3-A4.
Figure 10:
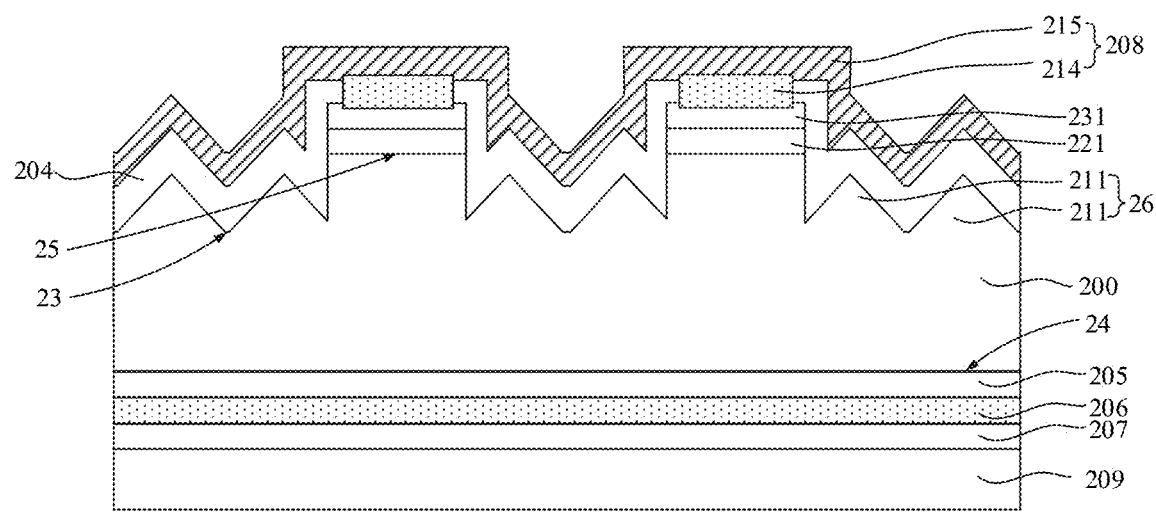
FIG. 10 is a cross-sectional view of a solar cell shown in FIG. 8 along B3-B4.

FIG. 6 is a local top view of a doped conductive sublayer in a solar cell provided according to another embodiment of the present application. FIG. 7 is a local top view of a spot electrode in a solar cell provided according to another embodiment of the present application. FIG. 8 is a local top view of a connecting electrode in a solar cell provided according to another embodiment of the present application. FIG. 9 is a cross-sectional view of a solar cell shown in FIG. 8 along A3-A4. FIG. 10 is a cross-sectional view of a solar cell shown in FIG. 8 along B3-B4.

Correspondingly, a solar cell is provided according to another embodiment of the present application, which is essentially the same as the solar cell provided according to the above embodiments. The difference is that the first doped conductive layer in the solar cell provided according to another embodiment includes multiple doped conductive sublayers, and the first doped conductive layer in the solar cell provided according to above embodiments is a whole layer, which has the same or corresponding technical features as the above embodiments, which will not be described herein.

Referring to FIG. 6 to FIG. 10, the solar cell includes a substrate 200 having electrode regions 20 and non-electrode regions 21 arranged alternatingly along a first direction X. The electrode regions 20 has a first surface 25, the non-electrode regions 21 has a second surface 26, and the first surface 25 has a smaller roughness than the second surface 26. The solar cell further includes a first tunneling dielectric layer 221 formed over the first surface 25, a first doped conductive layer 222 arranged on a side of the first tunneling dielectric layer 221 away from the substrate 200, a passivation layer 204 formed over the second surface 26 and the first doped conductive layer 222, and at least one first electrode 208 arranged along the first direction X. The at least one first electrode 208 are arranged in the electrode regions 20, each of the at least one first electrode 208 includes a connecting electrode 215 formed over the electrode regions 20 and multiple spot electrodes 214 arranged along a second direction Y. The multiple spot electrodes 214 are arranged below the connecting electrode 215 and connected to the connecting electrode 215. The multiple spot electrodes 214 penetrate through the passivation layer 204 to be in contact with the first doped conductive layer 222, and the connecting electrode 215 includes different materials from the multiple spot electrodes 214.

In some embodiments, the first doped conductive layer 222 includes multiple doped conductive sublayers 231 corresponding to the multiple spot electrodes 214, respectively. The multiple spot electrodes 214 pass through the passivation layer 204 to be in electrical contact with the multiple doped conductive sublayers 231. In this way, the light blocking area of the first doped conductive layer 222 can be reduced, and the optical loss of the solar cell can be reduced. In addition, compared to the first doped conductive layer as the entire layer, multiple doped conductive sublayers 231 can reduce the parasitic absorption of incident light by the first doped conductive layer 222, thereby reducing optical loss and improving the photoelectric conversion efficiency of the solar cell.

In some embodiments, the multiple spot electrodes 214 penetrate through the passivation layer 204 to be in electrical contact with the multiple doped conductive sublayers 231, respectively. In some embodiments, some of the multiple spot electrodes 214 do not penetrate the passivation layer 204 to be in electrical contact with the corresponding doped conductive sublayers 231.

In some embodiments, the first tunneling dielectric layer 221 includes multiple tunneling dielectric sublayers in a one-to-one correspondence to the multiple doped conductive sublayers 231. In some embodiments, the multiple first doped conductive sublayers 231 are arranged on the same first tunneling dielectric layer 221.

In some embodiments, an orthographic projection of each of the multiple spot electrodes 214 on a corresponding doped conductive sublayer 231 in within the corresponding doped conductive sublayer 231. In this way, it can be ensured that each of the multiple spot electrodes 214 is in electrical contact with the doped conductive sublayer 231 with a high doping concentration, which reduces the contact resistance between the multiple spot electrodes 214 and the multiple doped conductive sublayers 231, thereby reducing contact loss or electrical loss and improving the efficiency of the solar cell.

In some embodiments, a surface of a part of the substrate 200 between two adjacent doped conductive sublayers 231 can also have a first protrusion structure, thereby improving the photoelectric conversion efficiency of the solar cell.

In some embodiments, the setting and function of the doped conductive sublayers 231 can refer to the first doped conductive layer 122 in the above embodiments, and the setting and function of the tunneling dielectric sublayers can refer to the setting and function of the first tunneling dielectric layer 121 in the above embodiments, which will not be repeated here.

The solar cell provided by the above embodiments includes the first doped conductive layer 222 including multiple doped conductive sublayers 231, and the multiple spot electrodes 214 are in electrical contact with the multiple doped conductive sublayer 231, respectively, thereby reducing the shielding area of the first doped conductive layer 222 and parasitic absorption of incident light, reducing optical loss, and improving the photoelectric conversion efficiency of the solar cell.

Correspondingly, a solar cell is provided according to still another embodiment of the present application, which is essentially the same as the solar cell provided according to the above embodiments (shown in FIG. 6 to FIG. 10), the difference is that the solar cell provided according to still another embodiment includes an electrical connection layer, two opposite ends of the electrical connection layer along the first direction are in electrical contact with two adjacent doped conductive sublayers, respectively, and the same or corresponding technical features as the above embodiments will not be further elaborated here.

Figure 11:
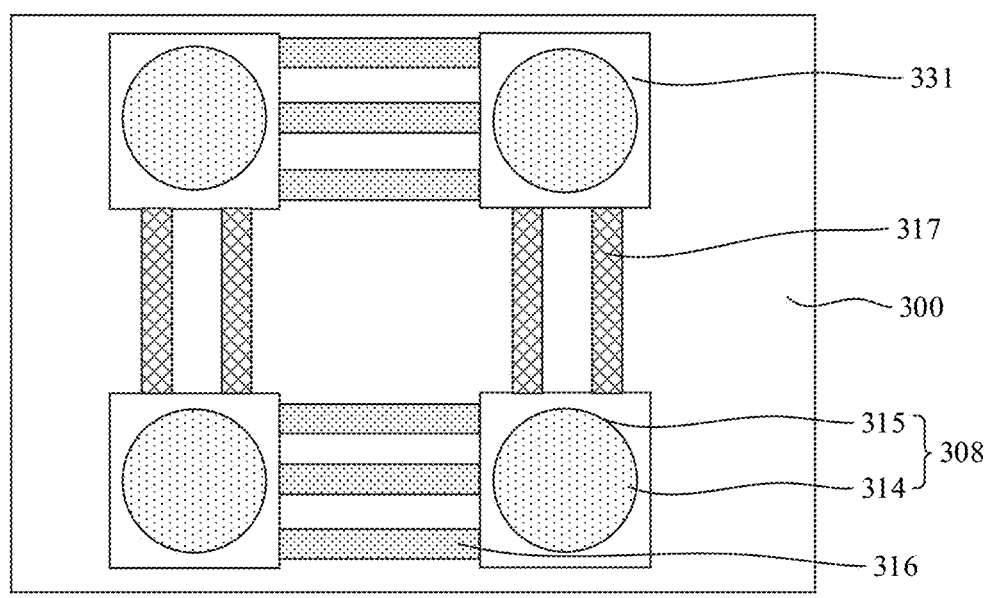
FIG. 11 is a local top view of a spot electrode in a solar cell provided according to yet another embodiment of the present application.
Figure 12:
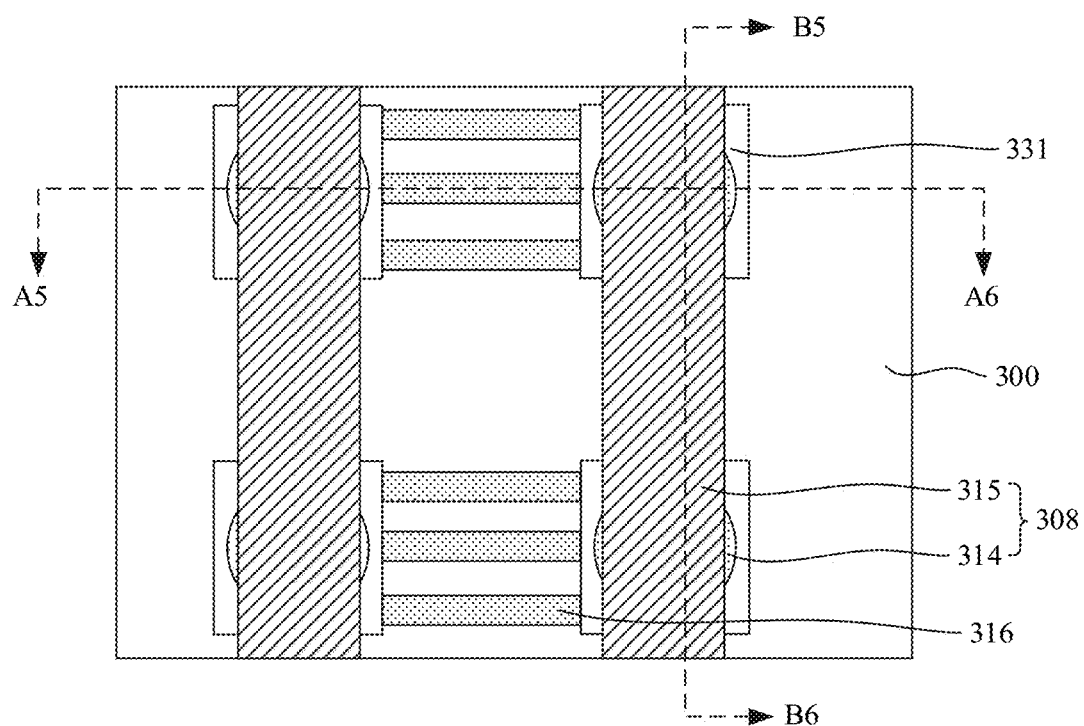
FIG. 12 is a local top view of a connecting electrode in a solar cell provided according to yet another embodiment of the present application.
Figure 13:
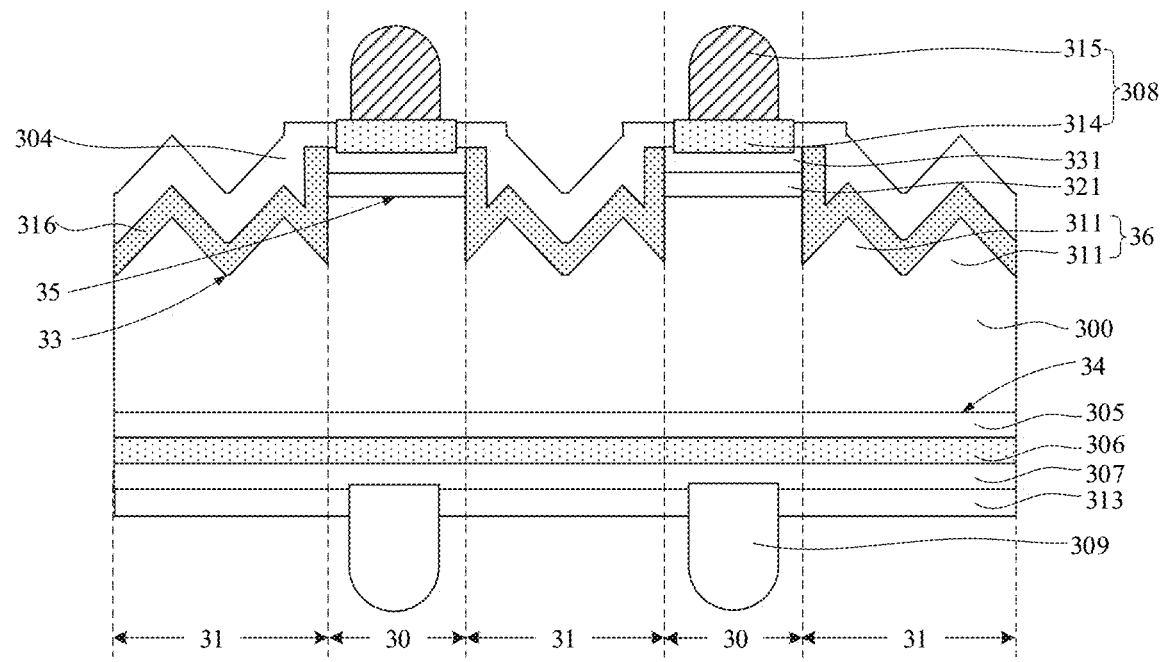
FIG. 13 is a cross-sectional view of a solar cell shown in FIG. 12 along A5-A6.
Figure 14:
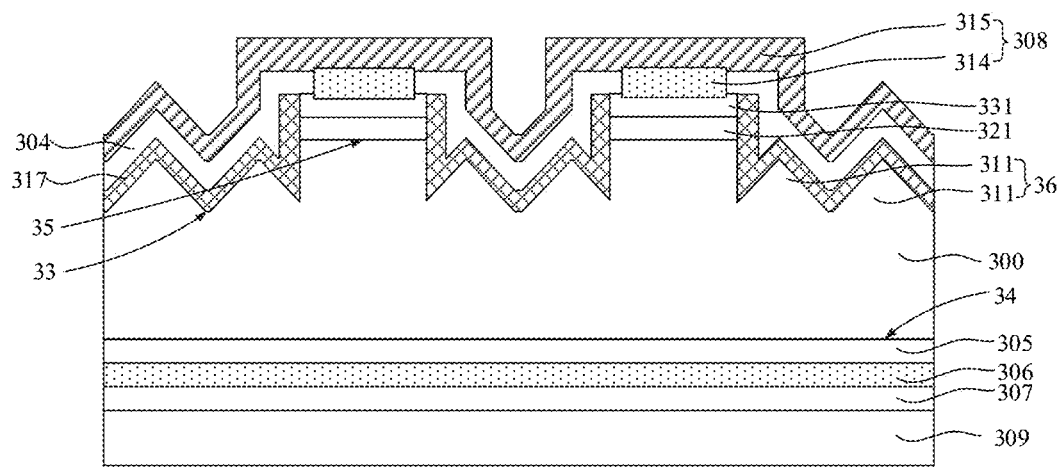
FIG. 14 is a cross-sectional view of a solar cell shown in FIG. 12 along B5-B6.

FIG. 11 is a local top view of a spot electrode in a solar cell provided according to yet another embodiment of the present application. FIG. 12 is a local top view of a connecting electrode in a solar cell provided according to yet another embodiment of the present application. FIG. 13 is a cross-sectional view of a solar cell shown in FIG. 12 along A5-A6. FIG. 14 is a cross-sectional view of a solar cell shown in FIG. 12 along B5-B6.

Referring to FIG. 11 to FIG. 14, the solar cell includes a substrate 300 having electrode regions 30 and non-electrode regions 31 arranged alternatingly along a first direction X. The electrode regions 30 has a first surface 35, the non-electrode regions 31 has a second surface 36, and the first surface 35 has a smaller roughness than the second surface 36. The solar cell further includes a first tunneling dielectric layer 321 formed over the first surface 35, a first doped conductive layer 322 arranged on a side of the first tunneling dielectric layer 321 away from the substrate 300, a passivation layer 304 formed over the second surface 36 and the first doped conductive layer 322, and at least one first electrode 308 arranged along the first direction X. The at least one first electrode 308 are arranged in the electrode regions 30, each of the at least one first electrode 308 includes a connecting electrode 315 formed over the electrode regions 30 and multiple spot electrodes 314 arranged along a second direction Y. The multiple spot electrodes 314 are arranged below the connecting electrode 315 and connected to the connecting electrode 315. The multiple spot electrodes 314 penetrate through the passivation layer 304 to be in contact with the first doped conductive layer 322, and the connecting electrode 315 includes different materials from the multiple spot electrodes 314.

In some embodiments, the first doped conductive layer 322 includes multiple tunneling dielectric sublayers 331 in a one-to-one correspondence to the multiple doped conductive sublayers 331. The multiple spot electrodes 314 penetrate through the passivation layer 304 to be in electrical contact with the multiple tunneling dielectric sublayers 331, respectively.

In some embodiments, an orthographic projection of each of the multiple spot electrodes 314 on a corresponding doped conductive sublayer 331 in within the corresponding doped conductive sublayer 331.

In some embodiments, the solar cell further includes: an electrical connection layer 316 arranged in the non-electrode regions 31, and the electrical connection layer 316 is arranged between the substrate 300 and the passivation layer 304. Two opposite ends of the electrical connection layer 316 along the first direction X are in electrical contact with two adjacent doped conductive sublayers 331, respectively.

In some embodiments, the electrical connection layer 316 is configured to enhance the carrier transmission capacity of the solar cell, and the electrical connection layer 316 is in direct contact with a side surface of each of the multiple doped conductive sublayers 331.

In some cases, the electrical connection layer 316 is in electrical contact with the top surface or the bottom surface of the doped conductive sublayer 331.

In some embodiments, the material of the electrical connection layer 316 is the same as that of the doped conductive sublayer 331. By setting the material of the electrical connection layer 316 and the doped conductive sublayer 331 to be the same, on the one hand, the variety of materials in the entire production process can be reduced for easy management, on the other hand, the material of the electrical connection layer 316 is the same as that of the doped conductive sublayer 331, which ensures good contact between the electrical connection layer 316 and the doped conductive sublayer 331, resulting in good transmission effect of carriers at the contact interface between the doped conductive sublayer 331 and the electrical connection layer 316, thereby reducing transmission losses. In addition, the transmission rates of carriers in the electrical connection layer 316 and the doped conductive sublayer 331 can be set to be similar or the same, thereby improving the transmission efficiency of carriers from the electrical connection layer 316 to the doped conductive sublayer 331. It is worth noting that the material similarity here refers to the same type and concentration of doping ions in the electrical connection layer 316 as in the doped conductive sublayer 331.

In some embodiments, the material of the electrical connection layer 316 can also be different from the material of the doped conductive sublayer 331. For example, the material of the electrical connection layer 316 may be one of doped amorphous silicon, doped polycrystalline silicon, or doped microcrystalline silicon, and the material of the doped conductive sublayer 331 may be another of doped amorphous silicon, doped polycrystalline silicon, or doped microcrystalline silicon.

In some embodiments, in response to the material of the electrical connection layer 316 being different from the material of the doped conductive sublayer 331, the absorption coefficient of the material of the electrical connection layer 316 for incident light can be set to be smaller than the absorption coefficient of the electrical connection layer 316 for incident light, which reduces the absorption capacity of the electrical connection layer 316 for incident light while improving the lateral transmission capacity of the carriers, thereby improving the utilization rate of the solar cell for incident light.

In some embodiments, there are multiple electrical connection layers 316 arranged at intervals along the second direction Y. The multiple electrical connection layers 316 are arranged between two adjacent doped conductive sublayers 331, so that most of the carriers in the substrate 300 can be transmitted to the doped conductive sublayer 331 through multiple electrical connection layers 316, thereby enhancing the lateral transmission ability of most of the carriers in the substrate 300. In addition, the multiple electrical connection layers 316 are arranged in intervals, that is, the multiple electrical connection layers 316 are not arranged to cover all areas between two adjacent doped conductive sublayers 331, but are arranged to cover some areas between the two adjacent doped conductive sublayers 331. In this way, in response to the material of the electrical connection layer 316 being the same as that of the doped conductive sublayer 331, the overall area of the multiple electrical connection layers 316 is not too large, thereby preventing the problem of low utilization of the substrate 300 for incident light due to the strong absorption ability of the multiple electrical connection layers 316 for incident light.

In some embodiments, the multiple electrical connection layers 316 are arranged in an array including multiple columns of electrical connection layers 316 arranged at intervals along the first direction X. The multiple electrical connection layers 316 in each column are arranged at intervals along the second direction Y, and there is at least one electrode 308 between two adjacent columns of electrical connection layers 316 along the first direction X. That is to say, in some embodiments, in response to there being only one electrode 308 between two adjacent electrical connection layers 316, there is an electrical connection layer 316 between every two adjacent electrodes 308. In other embodiments, there may also be multiple electrodes 308 between adjacent columns of electrical connection layers 316, such that some adjacent electrodes 308 have an electrical connection layer 316 between them, while some adjacent electrodes 308 do not have an electrical connection layer 316 between them. For example, along the second direction Y, there is an electrical connection layer 316 between a first electrode and a second electrode in each column of electrical connection layers 316, while there is no electrical connection layer 316 between the second electrode and a third electrode in each column of electrical connection layers 316. It can be understood that in response to the material of the electrical connection layer 316 being the same as the material of the doped conductive sublayer 331, the more the number of electrical connection layers 316, the stronger the absorption ability of incident light while enhancing the transverse ability of carriers. Therefore, based on the total number of electrodes 308 and the demand for current collection capacity of the electrodes 308, the connection relationship between the electrical connection layer 316 and the doped conductive sublayer 331 can be flexibly arranged, so that the electrical connection layer 316 will not have a strong absorption effect on the incident light while improving the carrier transmission capacity.

In some embodiments, there is at least one electrical connection layer 316 arranged between every two adjacent electrodes 308. In this way, the lateral transmission capacity between adjacent electrodes 308 is improved, thereby improving the current collection ability of each electrode 308.

In some embodiments, the electrical connection layers 316 in a column of electrical connection layers 316 are in one-to-one correspondence with the multiple electrical connection layers 316 in an adjacent column of electrical connection layers 316, and the two adjacent columns of electrical connection layers 316 are arranged at intervals along the first direction X. For example, each electrical connection layer 316 in a first column of electrical connection layers 316 is aligned with a corresponding electrical connection layer 316 in a second column of electrical connection layers 316 along the first direction X, and each column of electrical connection layers 316 are arranged in a regular manner, resulting in a larger number of electrical connection layers 316, which forms more channels for the transverse transmission of carriers in the substrate 300. In addition, due to the regular arrangement of each column of electrical connection layers 316, the process of forming the electrical connection layer 316 can be simplified in the actual preparation process.

In some embodiments, a column of electrical connection layers 316 and an adjacent column of electrical connection layers 316 are arranged in a staggered manner along the second direction Y, that is, each electrical connection layer 316 in the first column of electrical connection layers 316 is not aligned with each electrical connection layer 316 in the second column of electrical connection layers 316 along the first direction X, that is, each electrical connection layer 316 in the first column of electrical connection layers 316 is staggered with each electrical connection layer 316 in the second column of electrical connection layers 316 along the second direction Y, which ensures that the number of electrical connection layers 316 is not too large, thereby avoiding excessive absorption of incident light by the electrical connection layer 316. In addition, it is also possible to achieve uniform distribution of the electrical connection layers 316 on the first surface of the substrate 300 while reducing the number of installed electrical connection layers 316, thereby enhancing the lateral transmission ability of carriers at different positions in the substrate 300.

In some embodiments, along the second direction Y, the density of arranging the multiple electrical connection layers 316 close to an edge of the substrate 300 is greater than the density of arranging the multiple electrical connection layers 316 away from the edge of the substrate 300. For example, a distance between two adjacent electrical connection layers 316 close to the edge of the substrate 300 along the second direction Y is smaller than a distance between the two adjacent electrical connection layers 316 away from the edge of the substrate 300 along the second direction Y. In this way, the density of arranging the multiple electrical connection layers 316 close to an edge of the substrate 300 is greater than the density of arranging the multiple electrical connection layers 316 away from the edge of the substrate 300, that is, the lateral transmission ability of carriers in the substrate 300 corresponding to the edge of the substrate 300 is stronger, resulting in a higher concentration of carriers in the electrodes close to the edge of the substrate 300, which compensates for the number of carriers collected by the outermost at least one first electrode 108 and improves the ability of the outermost at least one first electrode 108 to collect current.

In some embodiments, the top surface of the electrical connection layer 316 is lower than or flush with the top surface of the doped conductive sublayer 331, which prevents the problem of side surfaces of the electrical connection layer 316 absorbing incident light due to the top surface of the electrical connection layer 316 protruding over the top surface of the doped conductive sublayer 331, thereby reducing the parasitic absorption ability of the electrical connection layer 316 to incident light. In the direction perpendicular to the surface of the substrate 300, a height of the electrical connection layer 316 may be 0.5 to 1.2 times that of the doped conductive sublayer 331.

In some embodiments, the electrical connection layer 316 is directly arranged on the surface of the substrate 300. In some embodiments, there is a first tunneling dielectric layer between the electrical connection layer 316 and the surface of the substrate 300.

In some embodiments, the solar cell further includes a conductive transmission layer 317 arranged in the electrode regions 30. Two opposite ends of the conductive transmission layer 317 are in electrical contact with two adjacent doped conductive sublayers 331 along the second direction Y, respectively. The conductive transmission layer 317 is configured to enhance the transmission ability of adjacent doped conductive sublayers 331 along the second direction Y.

Similarly, based on the technical effects brought by the material of the electrical connection layer 316 and the material of the doped conductive sublayer 331 being the same or different, the material of the conductive transmission layer 317 can be the same or different from the material of the doped conductive sublayer 331.

Figure 15:
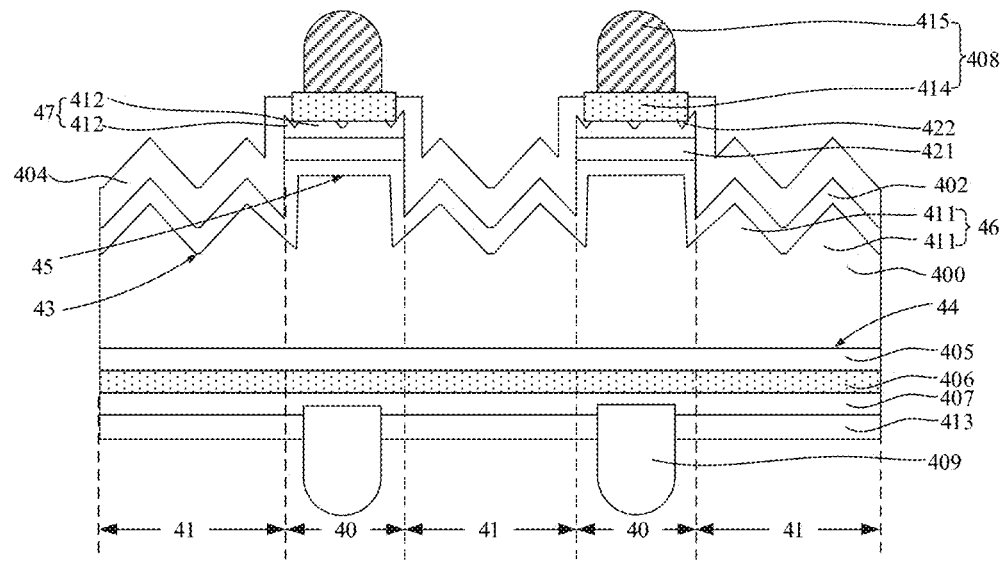
FIG. 15 is a first cross-sectional view of a solar cell provided according to still another embodiment of the present application.
Figure 16:
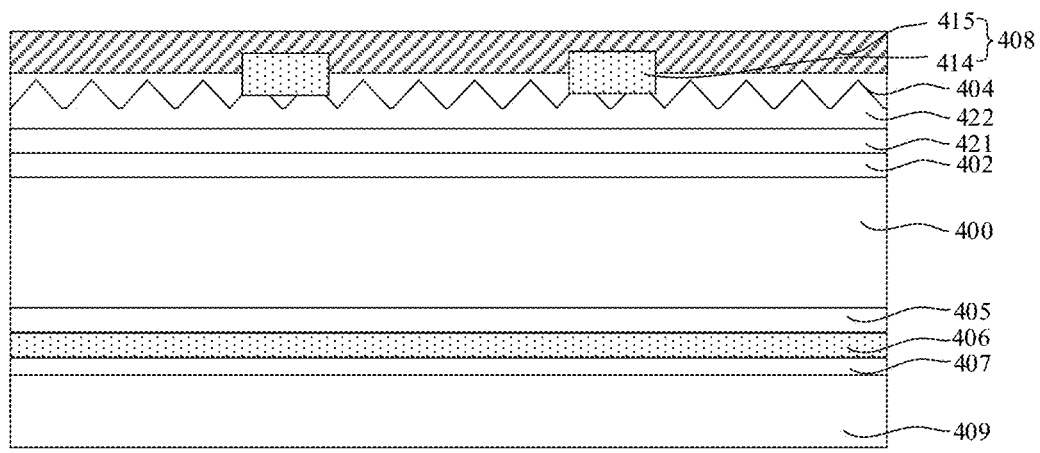
FIG. 16 is a second cross-sectional view of a solar cell provided according to still another embodiment of the present application.

FIG. 15 is a first cross-sectional view of a solar cell provided according to still another embodiment of the present application. FIG. 16 is a second cross-sectional view of a solar cell provided according to still another embodiment of the present application.

Referring to FIG. 15 and FIG. 16, the solar cell includes a substrate 400 having electrode regions 40 and non-electrode regions 41 arranged alternatingly along a first direction X. The electrode regions 40 has a first surface 45, the non-electrode regions 41 has a second surface 46, and the first surface 45 has a smaller roughness than the second surface 46. The solar cell further includes a first tunneling dielectric layer 421 formed over the first surface 45, a first doped conductive layer 422 arranged on a side of the first tunneling dielectric layer 421 away from the substrate 400, a passivation layer 404 formed over the second surface 46 and the first doped conductive layer 422, and at least one first electrode 408 arranged along the first direction X. The at least one first electrode 308 are arranged in the electrode regions 40, each of the at least one first electrode 408 includes a connecting electrode 415 formed over the electrode regions 40 and multiple spot electrodes 414 arranged along a second direction Y. The multiple spot electrodes 414 are arranged below the connecting electrode 415 and connected to the connecting electrode 415. The multiple spot electrodes 414 penetrate through the passivation layer 404 to be in contact with the first doped conductive layer 422, and the connecting electrode 415 includes different materials from the multiple spot electrodes 414.

In some embodiments, the first doped conductive layer 422 has a micro textured structure 47 on a side away from the first tunneling dielectric layer 421. The micro textured structure 47 includes multiple micro protrusion structures 412, and the size of each of the multiple micro protrusion structures 412 is smaller than that of the first protrusion structure 411. The roughness of the micro textured surface structure 47 is greater than that of the first surface 45. In response to the roughness of the micro textured surface structure 47 being larger, the contact performance between the multiple spot electrodes 414 and the first doped conductive layer 422 is better, resulting in higher welding tension between the multiple spot electrodes 414 and the first doped conductive layer 422, thereby improving the yield of the solar cell.

In some embodiments, the shape of the micro protrusion structure 412 includes a pyramid shape, a sine curve shape, or a parabolic shape.

It is worth noting that the definition of the size of the micro protrusion structure 412 is similar to the definition of the size of the first protrusion structure 111. It is only necessary to replace the surface of the substrate with the surface of the first doped conductive layer away from the substrate, which will not be repeated here.

In some embodiments, the size of the micro protrusion structure 412 is less than 1 μm. For example, the size of the micro protrusion structure 412 is less than 890 nm, the size of the micro protrusion structure 412 is less than 760 nm, the size of the micro protrusion structure 412 is less than 620 nm, the size of the micro protrusion structure 412 is less than 500 nm, or the size of the micro protrusion structure 412 is less than 320 nm. In this way, in response to the size of the micro protrusion structure 412 being within any of the above ranges, the size of the micro protrusion structure 412 is smaller, the time and degree of etching the first doped conductive layer 422 are smaller, which avoids significant etching losses on the first doped conductive layer 422, and ensures that the first doped conductive layer 422 has a good passivation effect.

In some embodiments, the height of the micro protrusion structure 412 is less than 1 μm. For example, the height of the micro protrusion structure 412 is less than 910 nm, the height of the micro protrusion structure 412 is less than 810 nm, the height of the micro protrusion structure 412 is less than 590 nm, the height of the micro protrusion structure 412 is less than 430 nm, or the height of the micro protrusion structure 412 is less than 220 nm. In this way, in response to the height of the micro protrusion structure 412 being within any of the above ranges, the height of the micro protrusion structure 412 is smaller, the roughness of the third surface structure 33 is smaller. The passivation layer 104 is not only arranged at recesses of the micro protrusion structure 412, but also at protrusions of the micro protrusion structure 412, thus providing a better interface composite effect. Among them, the height of the micro protrusion structure 412 refers to a vertical distance between the highest point of the micro protrusion structure 412 away from the first surface 45 and the bottom surface.

In addition, in response to the height and size of the micro protrusion structure 412 being within the above ranges, the micro protrusion structure 412 has a large aspect ratio. The inclined surface of the micro protrusion structure 412 can reflect incident light multiple times, thereby improving the utilization rate of light.

In some embodiments, the roughness of the second surface 44 is greater than that of the first surface 45, which means that the second surface 44 can be a surface with protrusions and recesses. By increasing the internal reflection of incident light, the utilization rate of light by the solar cell is improved, thereby improving the photoelectric conversion efficiency of the solar cell.

In some embodiments, the solar cell further includes an emitter 402 arranged in the electrode regions 40 and the non-electrode regions 41. The emitter 402 is arranged between the substrate 400 and the first tunneling dielectric layer 421, and between the substrate 400 and the passivation layer 404. The emitter 402 is conformal to the first surface 45 and the second surface 46. The PN junction is formed between the emitter 403 and the substrate 100, and the conductivity type of the first doping elements in the first doped conductive layer 422 is the same as that of the fifth doping elements in the emitter 402.

In some embodiments, the solar cell further includes a doped layer arranged between the substrate and the passivation layer in the non-electrode regions, and the conductivity type of fourth doping elements in the doped layer is the same as that of the first doping elements in the first doped conductive layer. The doped layer and the first doped conductive layer can form a PN junction as a whole between the substrate and the doped layer. The doped layer and the first doped conductive layer can also serve as a part of the passivate contact structure, which improves the carrier transmission efficiency by constructing a high-low junction between the doped layer and the substrate.

In some embodiments, the material of the doped layer includes at least one of microcrystalline silicon, amorphous silicon, polycrystalline silicon, or silicon carbide.

In some embodiments, in response to the fourth doping elements having a doping concentration less than or equal to the first doping elements, the doping concentration of the doped layer arranged opposite to the non-electrode regions is lower, the recombination effect is relatively small. The doping concentration of the first doped conductive layer arranged opposite to the electrode region is higher, the contact resistance between the electrode and the first doped conductive layer is smaller, and more doping elements can also serve as carriers, to improve the transmission efficiency of the solar cell.

It can be understood that the first doped conductive layer may be in partial contact with the doped layer between side surfaces, or the first doped conductive layer may be in complete contact with between the upper surface and the lower surface.

Figure 17:
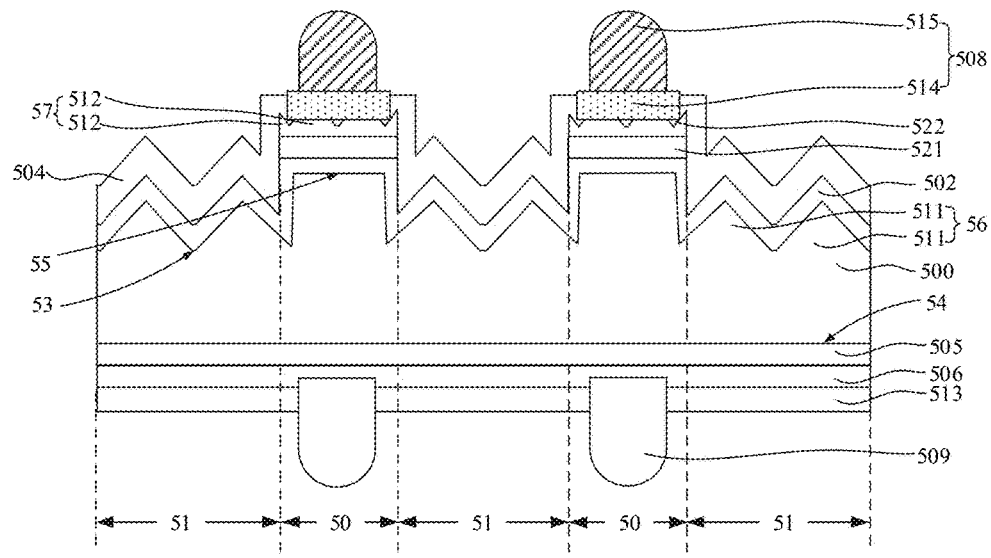
FIG. 17 is a third cross-sectional view of a solar cell provided according to still another embodiment of the present application.
Figure 18:
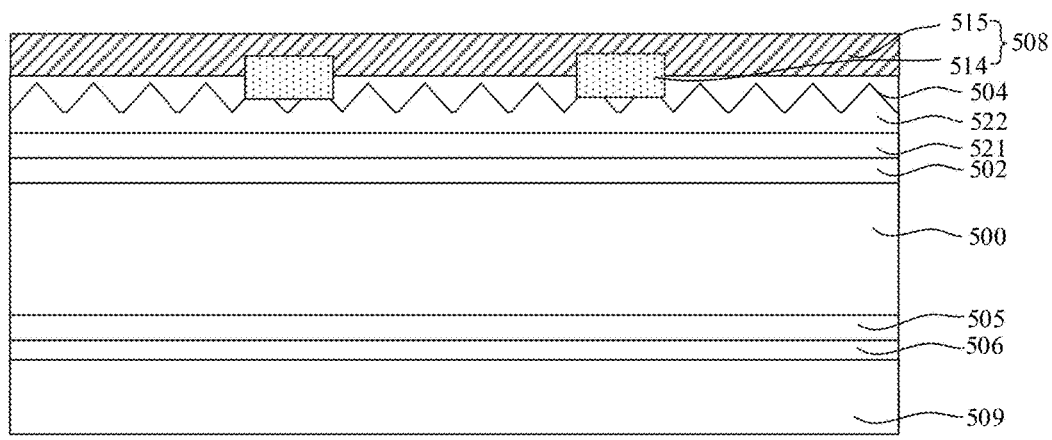
FIG. 18 is a fourth cross-sectional view of a solar cell provided according to still another embodiment of the present application.

FIG. 17 is a third cross-sectional view of a solar cell provided according to still another embodiment of the present application. FIG. 18 is a fourth cross-sectional view of a solar cell provided according to still another embodiment of the present application.

Referring to FIG. 17 to FIG. 18, the solar cell includes a substrate 500 having electrode regions 50 and non-electrode regions 51 arranged alternatingly along a first direction X. The electrode regions 50 has a first surface 55, the non-electrode regions 51 has a second surface 56, and the first surface 55 has a smaller roughness than the second surface 56. The solar cell further includes a first tunneling dielectric layer 521 formed over the first surface 55, a first doped conductive layer 522 arranged on a side of the first tunneling dielectric layer 521 away from the substrate 500, a passivation layer 504 formed over the second surface 56 and the first doped conductive layer 522, and at least one first electrode 508 arranged along the first direction X. The at least one first electrode 508 are arranged in the electrode regions 50, each of the at least one first electrode 508 includes a connecting electrode 515 formed over the electrode regions 50 and multiple spot electrodes 514 arranged along a second direction Y. The multiple spot electrodes 514 are arranged below the connecting electrode 515 and connected to the connecting electrode 515. The multiple spot electrodes 514 penetrate through the passivation layer 504 to be in contact with the first doped conductive layer 522, and the connecting electrode 515 includes different materials from the multiple spot electrodes 514.

The solar cell further includes a first passivation layer 505 arranged on the second side 54, and a second doped conductive layer 506 arranged on a side of the first passivation layer 505 away from the substrate 500. The first doped conductive layer 522 has one of N-type doping elements or P-type doping elements, and the second doped conductive layer 505 has the other of N-type doping elements or P-type doping elements.

In some embodiments, the first passivation layer 505 serves as a second tunneling dielectric layer, and the second tunneling dielectric layer and the second doped conductive layer form a passivate contact structure. The multiple spot electrodes penetrate the second passivation layer to be in electrical contact with the first doped conductive layer. Among them, the function and setting of the second tunneling dielectric layer can refer to the function and setting of the first tunneling dielectric layer, which will not be elaborated here. Similarly, the function and setting of the second doped conductive layer can refer to the function and setting of the first doped conductive layer.

Figure 19:
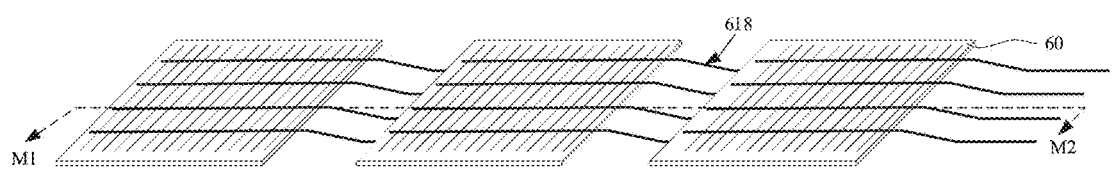
FIG. 19 is a schematic structural view of a photovoltaic module provided according to an embodiment of the present application.
Figure 20:
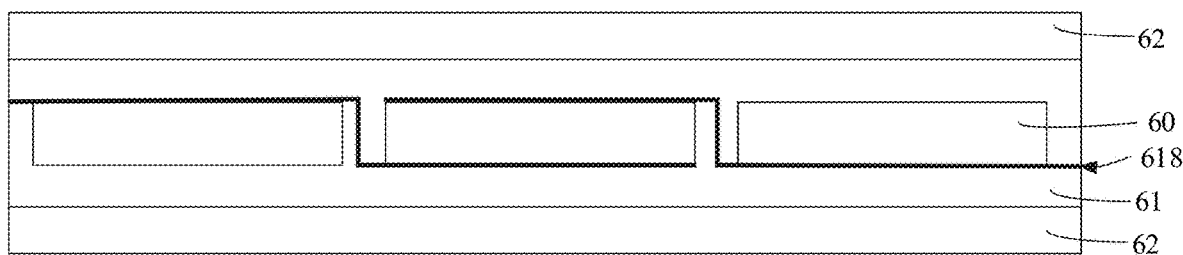
FIG. 20 is a cross-sectional view of the photovoltaic module shown in FIG. 19 along M1-M2.

FIG. 19 is a schematic structural view of a photovoltaic module provided according to an embodiment of the present application. FIG. 20 is a cross-sectional view of the photovoltaic module shown in FIG. 19 along M1-M2.

Correspondingly, according to some embodiments of the present application, in the second aspect, a photovoltaic module is further provided according to the embodiments of the present application. Referring to FIG. 19 and FIG. 20, the photovoltaic module includes: at least one cell string formed by connecting multiple the solar cell 60 according to any one of above embodiments in the first aspect. The photovoltaic module further includes at least one encapsulation adhesive film 61 configured to cover the at least one cell string, and at least one cover plate 62 configured to cover the at least one encapsulation adhesive film 61.

Specifically, in some embodiments, multiple cell strings can be electrically connected through conductive strips 618. FIG. 19 only illustrates the positional relationship between solar cells, where the electrodes with the same polarity are arranged in the same direction or with positive polarity for each cell towards the same side, so that the conductive strips are connected to different sides of two adjacent cells. In some embodiments, the solar cells can also be arranged in order of electrodes with different polarities facing the same side, that is, the electrodes of adjacent multiple solar cells are sorted in order of first polarity, second polarity, and first polarity, and the conductive strips are connected to two adjacent solar cells on the same side.

In some embodiments, there is no distance between the solar cells, that is, the solar cells overlap with each other.

In some embodiments, the encapsulation adhesive film 61 includes a first encapsulation adhesive film and a second encapsulation adhesive film. The first encapsulation adhesive film is configured to cover one of the front surface and rear surface of the solar cell 60, and the second encapsulation adhesive film is configured to cover the other of the front surface and rear surface of the solar cell 60. Specifically, at least one of the first encapsulation adhesive film or second encapsulation adhesive film is an organic encapsulation adhesive film such as polyvinyl butyral (PVB) adhesive film, ethylene vinyl acetate copolymer (EVA) film, polyethylene octene co elastomer (POE) film, or polyethylene terephthalate (PET) film.

It can be understood that there is a boundary between the first encapsulation adhesive film and the second encapsulation adhesive film before lamination. After lamination, there is no concept about the first encapsulation adhesive film and the second encapsulation adhesive film anymore, that is, the first encapsulation adhesive film and the second encapsulation adhesive film have already formed the overall encapsulation adhesive film 61 as a whole.

In some embodiments, the at least one cover plate 62 is a glass cover plate, a plastic cover plate, or other cover plates with light transmission function. Specifically, the surface of the cover plate 62 opposite to the at least one encapsulation adhesive film 61 has a surface with protrusions and recesses, thereby increasing the utilization of incident light. The at least one cover plate 62 includes a first cover plate and a second cover plate. The first cover plate is arranged opposite to the first encapsulation adhesive film, and the second cover plate is arranged opposite to the second encapsulation adhesive film.

Correspondingly, according to some embodiments of the present application, in a third aspect, a method for preparing a solar cell is further provided according to the present embodiments, and the method can be used to prepare the solar cell provided by the above embodiments in the first aspect. The same or corresponding technical features as the above embodiments will not be repeated here.

The method includes providing an initial substrate having an initial surface structure. The initial substrate has electrode regions and non-electrode regions arranged alternatingly.

In some embodiments, the initial substrate includes a first side and a second side. The first side has an initial surface structure, which includes a polished surface.

In response to the solar cell shown in FIG. 16 being formed, before forming the initial dielectric layer, the method further includes performing diffusion treatment on the first side of the initial substrate to form a diffusion layer to convert a part of the initial substrate into an emitter along a thickness direction of the initial substrate, that is, a surface of the emitter is the first side of the substrate.

The method includes: forming an initial dielectric layer and a conductive film. The initial dielectric layer is configured to cover the initial surface structure, and the conductive film is configured to cover the surface of the initial dielectric layer.

The method includes performing an etching process on the conductive film to enable a surface of the conductive film away from the initial dielectric layer to have a micro textured structure, which includes at least one micro protrusion structure.

In some embodiments, the etching process includes solution etching process and laser etching process.

The method includes forming a mask layer on a part pf the surface of the conductive film in the electrode regions. The materials of the mask layer include organic wax, metal, or silica mask.

In some embodiments, forming a mask layer using a printing process.

The method includes removing a part of the initial dielectric layer and a part of the conductive film in the non-electrode regions, retaining a part of the initial dielectric layer in the electrode regions as the tunneling dielectric layer, retaining a part of the conductive film in the electrode regions as the first doped conductive layer, removing the mask layer.

The method includes: performing a texturing treatment on a part of the initial surface structure in the non-electrode regions to enable a part of the surface of the substrate in the non-electrode regions to serve as the second surface, retaining a part of the initial surface structure in the electrode regions as the first surface, and using the remaining initial substrate as the substrate.

The method includes forming a passivation layer arranged in the surface of the non-electrode regions and the surface of the first doped conductive layer.

The method includes: forming multiple spot electrodes and a connecting electrode arranged in the electrode regions. The multiple spot electrodes pass through the passivation layer to be in electrical contact with the first doped conductive layer.

The method includes: forming a first passivation layer, a second doped conductive layer, and multiple second electrodes.

In some embodiments, the operation of providing a substrate includes providing an initial substrate having a textured surface. The initial substrate has electrode regions and non-electrode regions arranged alternatingly. The operation further includes removing a part of the textured structure from the electrode regions to form a first surface, and retaining a part of the textured structure from the non-electrode regions as the second surface.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present application is disclosed as a preferred embodiment, it is not intended to limit the claims. Any person skilled in the art may make several possible changes and modifications without departing from the concept of the present application. Therefore, the scope of protection of the present application should be based on the scope defined in the claims of the present application. In addition, the embodiments of the present application specification and the accompanying drawings are only illustrative examples and are not the entire scope protected by the claims of the present application.

Those of ordinary skill in the art can understand that the above embodiments are specific embodiments of the present application, and in practical applications, various changes may be made in form and details without deviating from the spirit and scope of the present application. Any one of ordinary skills in the art may make various changes and modifications without departing from the spirit and scope of the present application. Therefore, the scope of protection of the present application shall be subject to the scope limited by the claims.

What is claimed is:

1. A solar cell, comprising:
   a substrate having electrode regions and non-electrode regions, wherein the electrode regions are arranged alternatingly with the non-electrode regions, wherein the electrode regions have surface roughness less than surface roughness of the non-electrode regions;
   a first tunneling dielectric layer having portions formed over the electrode regions, respectively;
   a first doped conductive layer formed over the first tunneling dielectric layer;
   a passivation layer formed over the non-electrode regions and the first doped conductive layer; and
   at least one first electrode formed over respective ones of the electrode regions, wherein a respective first electrode of the plurality of first electrodes includes a respective connecting electrode formed over a respective electrode region of the electrode regions and a plurality of spot electrodes arranged at intervals along a second direction, the plurality of spot electrodes are arranged below at least an upper portion of the connecting electrode and connected to the connecting electrode, the plurality of spot electrodes penetrate the passivation layer to be in contact with the first doped conductive layer, and the connecting electrode includes at least one material that is different from a material included in the plurality of spot electrodes.

2. The solar cell according to claim 1, wherein each of the first doped conductive layers includes a plurality of doped conductive sublayers corresponding to the plurality of spot electrodes, respectively, and the plurality of spot electrodes penetrate through the passivation layer to be in electrical contact with the plurality of doped conductive sublayers, respectively.

3. The solar cell according to claim 2, wherein each of the first tunneling dielectric layers includes a plurality of tunneling dielectric sublayers correspond to the plurality of doped conductive sublayers, respectively.

4. The solar cell according to claim 2, wherein an orthographic projection of each of the plurality of spot electrodes is arranged within a corresponding doped conductive sublayer in the plurality of doped conductive sublayers.

5. The solar cell according to claim 2, further comprising an electrical connection layer arranged in the non-electrode regions between the substrate and the passivation layer, two opposite ends of the electrical connection layer along the first direction are in electrical contact with two adjacent doped conductive sublayers of the plurality of doped conductive sublayers, respectively.

6. The solar cell according to claim 1, wherein a distance between two adjacent spot electrodes along the second direction is a first distance, a length of the plurality of spot electrodes along the second direction is a first length, and a ratio of the first distance to the first length is from 10 to 400.

7. The solar cell according to claim 6, wherein the first length ranges from 5 μm to 50 μm.

8. The solar cell according to claim 1, wherein the connecting electrode has a second length along the second direction, and a ratio of a total length of the plurality of spot electrodes along the second direction to the second length is from 0.003 to 0.2.

9. The solar cell according to claim 1, wherein there are N spot electrodes arranged below the connecting electrode, and N is greater or equal to 100.

10. The solar cell according to claim 1, wherein each of the non-electrode regions has a plurality of first protrusion structures, the first doped conductive layer has a micro textured structure including a plurality of micro protrusion structures on a side away from the first tunneling dielectric layer, the plurality of micro protrusion structures are smaller than the plurality of first protrusion structures, and the micro textured surface structure has a greater roughness than the electrode regions.

11. The solar cell according to claim 1, wherein the electrode regions have a surface with a roughness of less than or equal to 5 μm and greater than or equal to −5 μm.

12. The solar cell according to claim 1, wherein the substrate has a first side and a second side opposite to the first side, the first side comprises the electrode regions and the non-electrode regions, and the solar cell further comprises:
a first passivation layer arranged on the second side; and
a second doped conductive layer arranged on a side of the first passivation layer away from the substrate, the first doped conductive layer has one of N-type doping elements or P-type doping elements, and the second doped conductive layer has the other of N-type doping elements or P-type doping elements.

13. The solar cell according to claim 1, wherein third doping elements in the substrate has a same conductivity type as first doping elements in the first doped conductive layer.

14. The solar cell according to claim 12, wherein the second side has a greater roughness than the electrode regions.

15. The solar cell according to claim 1, further comprising: an emitter arranged in the electrode regions and the non-electrode regions, wherein the emitter is arranged between the substrate and the first tunneling dielectric layer, and arranged between the substrate and the passivation layer, and the emitter is conformal to the electrode regions and the non-electrode regions.

16. The solar cell according to claim 1, further comprising a doped layer arranged between part of the substrate in the non-electrode regions and the passivation layer, and fourth doping elements in the doped layer has a same conductivity type as first doping elements in the first doped conductive layer.

17. The solar cell according to claim 16, wherein the fourth doping elements have a doping concentration less than or equal to the first doping elements.

18. The solar cell according to claim 1, wherein the solar cell further comprises a transparent conductive layer and a second passivation layer stacked together, the transparent conductive layer is formed over the intrinsic passivation layer.

19. The solar cell according to claim 18, wherein the solar cell further comprises a plurality of second electrodes penetrating through the second passivation layer to be in electrical contact with the transparent conductive layer.

20. A photovoltaic module, comprising:
at least one cell string formed by connecting a plurality of the solar cell according to claim 1;
at least one encapsulation adhesive film configured to cover the at least one cell string; and
at least one cover plate configured to cover the at least one encapsulation adhesive film.

* * * * *